(12) United States Patent
Takatani et al.

(10) Patent No.: US 8,970,998 B2
(45) Date of Patent: Mar. 3, 2015

(54) COMPOUND SEMICONDUCTOR ESD PROTECTION DEVICES

(71) Applicant: WIN Semiconductor Corp., Kuei Shan Hsiang, Tao Yuan Shien (TW)

(72) Inventors: Shinichiro Takatani, Tao Yuan Shien (TW); Jung-Tao Chung, Tao Yuan Shien (TW); Chi-Wei Wang, Tao Yuan Shien (TW); Cheng-Guan Yuan, Tao Yuan Shien (TW); Shih-Ming Joseph Liu, Tao Yuan Shien (TW)

(73) Assignee: WIN Semiconductors Corp., Kuei Shan Hsiang, Tao Yuan Shien (TW)

( * ) Notice: Subject to any disclaimer, the term of this patent is extended or adjusted under 35 U.S.C. 154(b) by 8 days.

(21) Appl. No.: 13/731,977

(22) Filed: Dec. 31, 2012

(65) Prior Publication Data

US 2014/0183544 A1    Jul. 3, 2014

(51) Int. Cl.
*H02H 3/22* (2006.01)
*H01L 29/20* (2006.01)
*H01L 27/04* (2006.01)
*H01L 29/778* (2006.01)

(52) U.S. Cl.
CPC ............ *H01L 29/2003* (2013.01); *H01L 27/04* (2013.01); *H01L 29/778* (2013.01)
USPC ............................................. 361/56; 361/111

(58) Field of Classification Search
USPC .......................................... 361/56, 91.1, 111
See application file for complete search history.

(56) References Cited

U.S. PATENT DOCUMENTS

| | | | |
|---|---|---|---|
| 7,881,030 B1 * | 2/2011 | Li et al. ............................ | 361/56 |
| 2012/0001230 A1 * | 1/2012 | Takatani ........................ | 257/194 |
| 2014/0084347 A1 * | 3/2014 | Salcedo et al. ................. | 257/195 |

* cited by examiner

*Primary Examiner* — Danny Nguyen
(74) *Attorney, Agent, or Firm* — Muncy, Geissler, Olds & Lowe, P.C.

(57) ABSTRACT

The present invention relates to compound semiconductor ESD protection devices of three types. The device comprises a multi-gate enhancement mode PET (E-PET). For the type I compound semiconductor ESD protection device, the source electrode is connected to the plural gate electrodes through at least one first resistor, and the drain electrode is connected to the plural gate electrodes through at least one second resistor. For the type II compound semiconductor ESD protection device, at least one of the plural gate electrodes are connected to at least one of the inter-gate regions between two adjacent gate electrodes through at least one fourth resistor. For the type compound semiconductor ESD protection device, the plural gate electrodes are connected to the source or drain electrodes through at least one seventh resistor. Any two gate electrodes in the three types of compound semiconductor ESD protection devices can be connected by a resistor.

45 Claims, 32 Drawing Sheets

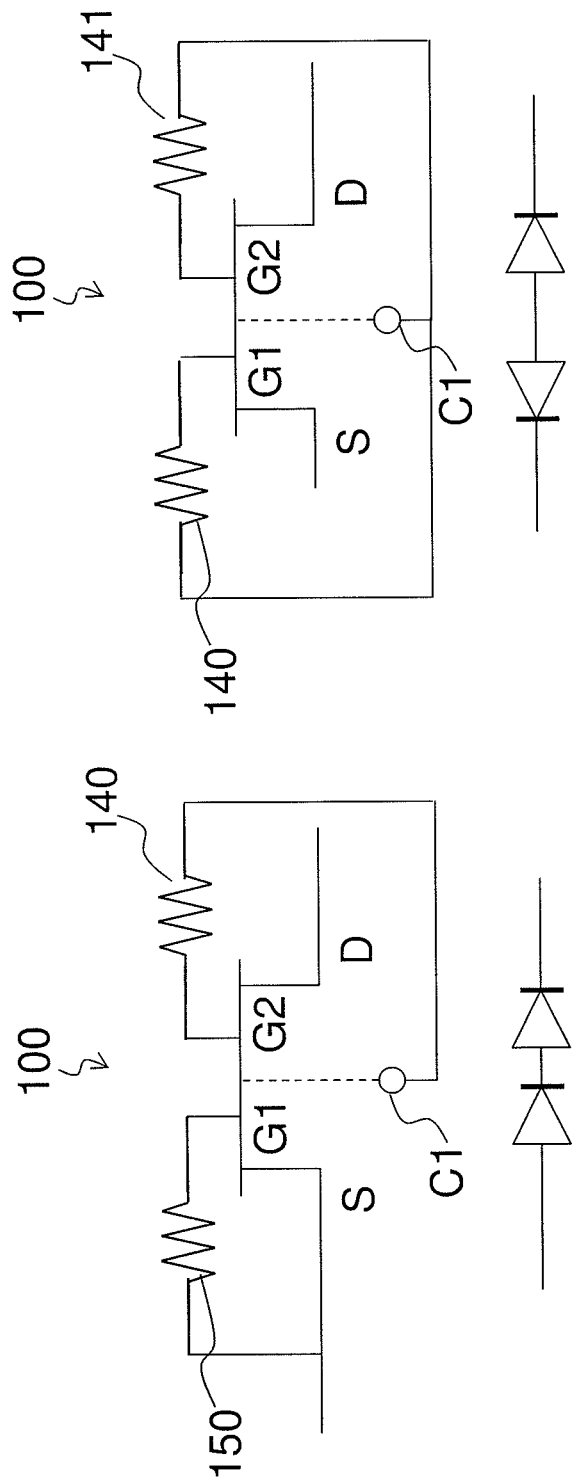

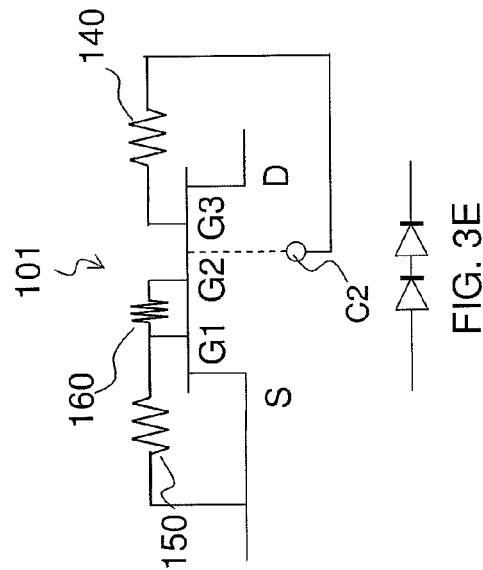
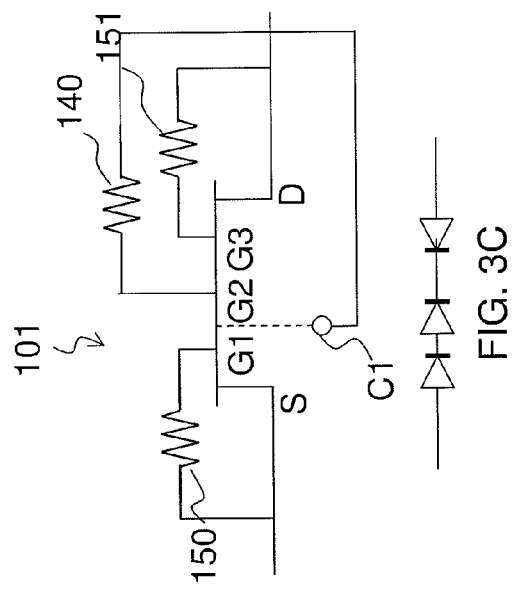
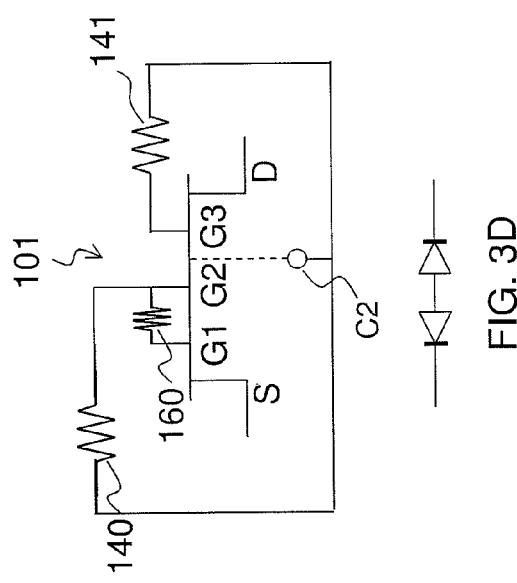

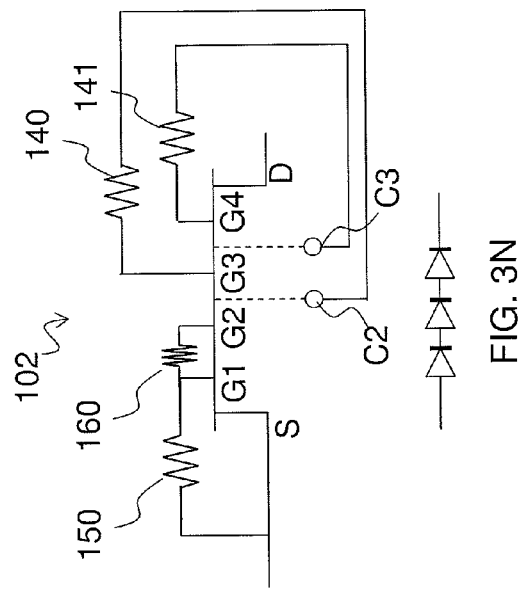
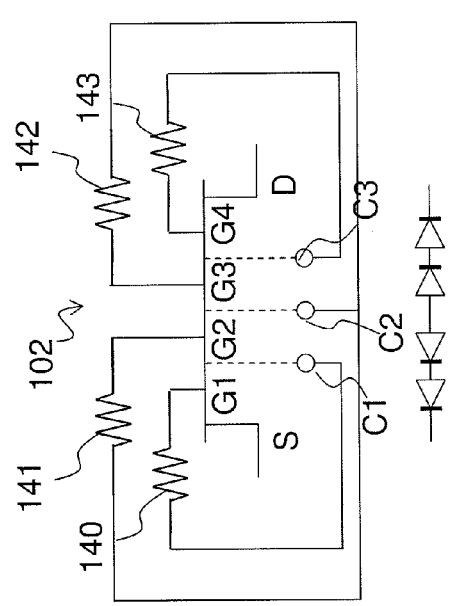
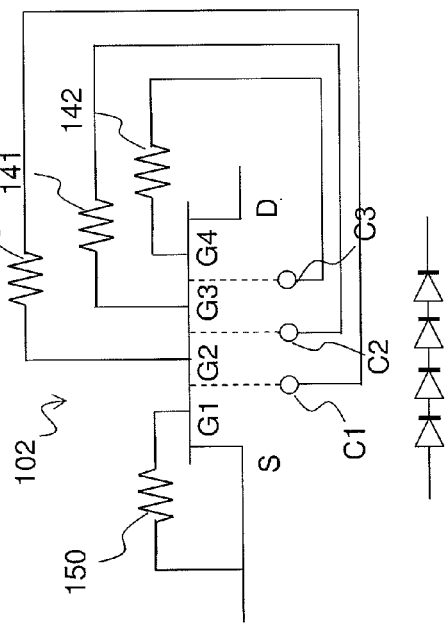

Series connected E-FET with the same opposite

Series connected E-FET with the same opposite

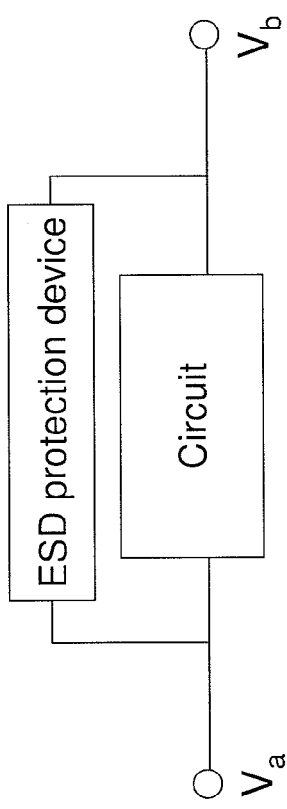
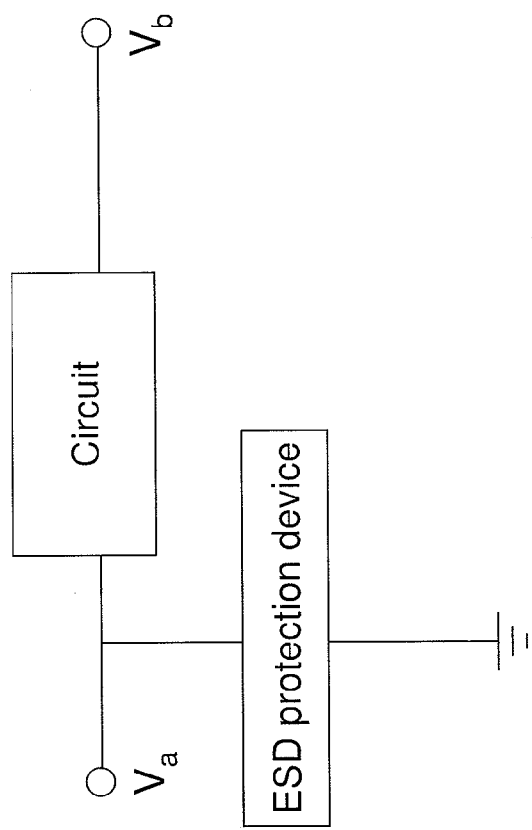
FIG. 8A (Prior Art)
FIG. 8B (Prior Art)

COMPOUND SEMICONDUCTOR ESD PROTECTION DEVICES

FIELD OF THE INVENTION

The present invention relates to compound semiconductor devices, and more particularly, to compound semiconductor electrostatic discharge protection devices.

BACKGROUND OF THE INVENTION

An integrated circuit (IC) connected to external terminals is vulnerable to electrostatic discharge (ESD) pulses from the operating environment and peripherals such as human bodies or machines. An ESD event may produce high current or high voltage pulses within a few nanoseconds, leading to device degradation or damage. In order to protect the vulnerable IC from ESD damaging pulses, an ESD protection circuit has to be connected to the external terminals of main IC elements.

Compound semiconductor devices have been widely used in the radio frequency (RF) circuits market. For example, compound semiconductor high electron mobility transistor (HEMT) switch have been widely applied in 3G cell phone applications in recent year for their high performance in RF range. However, the lack of good ESD protection devices has become a major drawback in HEMT switch applications. Conventionally, ESD protection circuits are made of series-connected diodes. A single enhancement-mode FET (E-FET) with the gate connected to the source with a resistor can act as an E-FET diode with different turn-on voltage for forward and reverse bias voltage $V_{on\_forward}$ and $V_{on\_reverse}$, as shown in FIG. 7A. The $V_{on\_forward}$ is small and is equal to the pinch-off voltage of the E-FET, and the $V_{on\_reverse}$ is large and is determined by the voltage drop across the resistor due to the reverse gate leakage current. The $V_{on\_reverse}$ can be adjusted to some extent by using a resistor with different resistance. An E-FET with its gate connected to the source by a resistor can thus be used as an ESD protection device. As shown in FIG. 7B, the positive and negative turn-on voltages ($V_{on\_p}$, and $V_{on\_n}$) can be multiplied by series connection of more than two E-FET diodes in the same direction. If two diodes are connected in opposite directions, both the positive and negative turn-on voltages ($V_{on\_p}$, and $B_{o\_n}$) are determined by the reverse turn-on voltage of the single diode as shown in FIG. 7C. By applying series connected E-FET diodes for each direction, both of the overall positive and negative turn-on voltage can be adjusted (FIG. 7D).

Consider a circuit with an ESD protection device using E-FET diodes, as shown in FIG. 8A. For the ESD protection device to remain turned off during the circuit operation, $V_{on\_p}$ and $V_{on\_N}$ must satisfy the equations below at any instance:

$$V_{on\_N} < V_b - V_a < V_{on\_P},$$

where $V_a$ and $V_b$ are voltages at the two terminals of the circuit under operation. For the case shown in FIG. 8B, $V_{on\_p}$ and $V_{on\_N}$ must satisfy the equations below at any instance:

$$V_{on\_N} < V_a < V_{on\_P}.$$

To meet the above conditions, the number of series connected E-FET diodes needed could be large. With increasing number of diodes connected in series in the same direction and/or the opposite direction, the area occupied by the whole ESD protection device becomes large, which results in the increase in the total chip size.

SUMMARY OF THE INVENTION

The main object of the present invention is to provide a compound semiconductor ESD protection device using a multi-gate E-FET with at least one of the gates connected to the source, the drain or a region between two adjacent gates. The total device area can be made smaller than an ESD protection device using plural series connected single-gate E-FET diodes. The chip size is greatly reduced when the ESD protection device is integrated in a compound semiconductor circuit to be protected.

Another object of the present invention is to provide a compound semiconductor ESD protection device using a compound semiconductor multi-gate E-FETs with at lease one of the gates connected by a resistor to another gate connected by another resistor to the source, the drain, or the region between two adjacent gates. The input RF signal is divided into the two gate electrodes connected with the resistor. As a result, the RF voltage amplitude of each of the gate electrodes is reduced and the overall linearity of the ESD protection device is improved.

To reach the objects stated above, the present invention provides three types of compound semiconductor ESD protection devices. The type I compound semiconductor ESD protection device comprises a multi-gate E-FET, at least one first resistor, and at least one second resistor. The multi-gate E-FET comprises a source electrode, a drain electrode, and plural gate electrodes disposed between the source and drain electrodes. The source electrode is connected to at least one of the plural gate electrodes through the at least one first resistor, and the drain electrode is connected to at least one of the plural gate electrodes through the at least one second resistor.

The type I compound semiconductor ESD protection device described above may further include at least one third resistor connecting two gate electrodes among the plural gate electrodes. Through one of the at least one third resistor, a gate electrode is connected to another gate electrode that is directly or indirectly connected to the source or drain electrodes, so that the gate electrode can be connected to the source or drain electrodes directly or indirectly as well.

The type II compound semiconductor ESD protection device provided by the present invention comprises a multi-gate E-FET and at least one fourth resistor. The multi-gate E-FET comprises a source electrode, a drain electrode, and plural gate electrodes disposed between the source and drain electrodes. At least one of the plural gate electrodes is connected to at least one of the inter-gate regions between two adjacent gate electrodes through the at least one fourth resistor.

The type II compound semiconductor ESD protection device described above may further include at least one fifth resistor connecting at least one of the plural gate electrodes to the source or the drain electrodes.

The type II compound semiconductor ESD protection device described above may further include at least one sixth resistor connecting two gate electrodes among the plural gate electrodes. The function of the sixth resistor is the same as the third resistor. A gate electrode is connected to another gate electrode that is directly or indirectly connected to the source electrode, the drain electrode, or at least one of the inter-gate regions between two adjacent gate electrodes through one of the at least one sixth resistor, so that the gate electrode can be connected to the source electrode, the drain electrode, or at least one of the inter-gate regions between two adjacent gate electrodes directly or indirectly as well.

The type III compound semiconductor ESD protection device provided by the present invention comprises a multi-gate E-FET, at least one seventh resistor, and at least one eighth resistor. The multi-gate E-FET comprises a source electrode, a drain electrode, and plural gate electrodes disposed between the source and drain electrodes. The plural gate electrodes are connected to the source or drain electrodes through the at least one seventh resistor. The function of the eighth resistor is the same as the third resistor. A gate electrode is connected to another gate electrode that is directly or indirectly connected to the source or drain electrodes through one of the at least one eighth resistor, so that the gate electrode can be connected to the source or drain electrodes directly or indirectly as well In implementation, the multi-gate E-FET can be a GaAs FET.

In implementation, the GaAs multi-gate enhancement mode FET can be a high electron mobility transistor (HEMT) or a pseudomorphic high electron mobility transistor (pHEMT).

In implementation, the multi-gate E-FET can be a GaN FET.

In implementation, the source and drain electrodes are multi-finger electrodes interposed each other, and the plural gate electrodes can be multi-finger electrodes interposed each other disposed between the source and drain electrodes.

In implementation, the source and drain electrodes are multi-finger electrodes interposed each other, and the plural gate electrodes can be meandering gate electrodes disposed between the source and drain electrodes with the bend around portions of the meandering gate within the active region of the E-FET.

In implementation, the width of each gate electrode of the plural gate electrodes is ranging from 0.1 mm to 10 mm.

In implementation, the resistance of the first to the eighth resistors are ranging from $2\times10^2$ to $2\times10^4$ ohms.

The present invention will be understood more fully by reference to the detailed description of the drawings and the preferred embodiments below.

BRIEF DESCRIPTION OF DRAWINGS

FIGS. 8A and 8B are schematics showing circuits with ESD protection devices using E-FET diodes.

DETAILED DESCRIPTIONS OF PREFERRED EMBODIMENTS

Type I Compound Semiconductor ESD Protection Device

FIG. 1A~1E are circuit diagrams showing embodiments of the type I compound semiconductor ESD protection device provided by the present invention. The type I compound semiconductor ESD protection device is equivalent to a circuit having two diodes connected in opposite directions. The type I compound semiconductor ESD protection device comprises a multi-gate E-FET (100~102), at least one first resistor 110, and at least one second resistor 120. The multi-gate E-FET comprises a source electrode S, a drain electrode D, and plural gate electrodes (G1~G4) disposed between the source and drain electrodes. The source electrode S is connected to at least one of the plural gate electrodes through the at least one first resistor 110, and the drain electrode is connected to at least one of the plural gate electrodes through the at least one second resistor 120. In these embodiments, the type I ESD compound semiconductor protection device may further include one or more third resistors (130~131) for connecting two gate electrodes. The electrical connection of any two objects described throughout the specification includes a direct connection and an indirect connection, for instance, a gate electrode can be electrically connected to the source electrode directly by a first resistor or indirectly by connecting to another gate electrode that is directly connected to the source electrode by a first resistor.

Figure 1A:
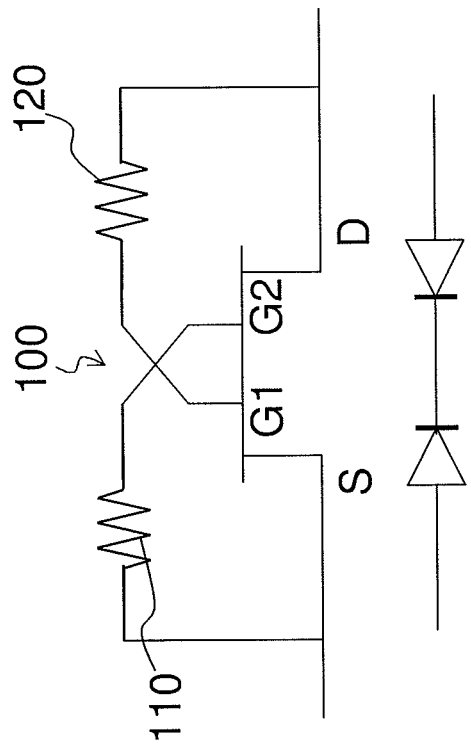
FIG. 1A~1E are circuit diagrams showing embodiments of the type I compound semiconductor ESD protection device provided by the present invention.
Figure 1B:
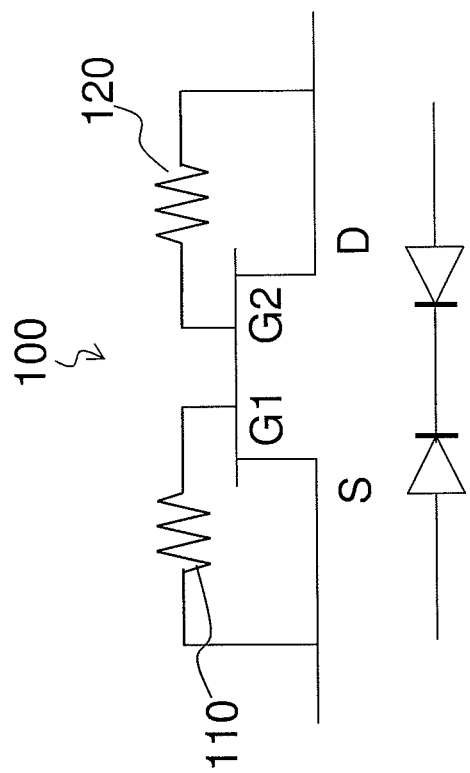
Figure 1C:
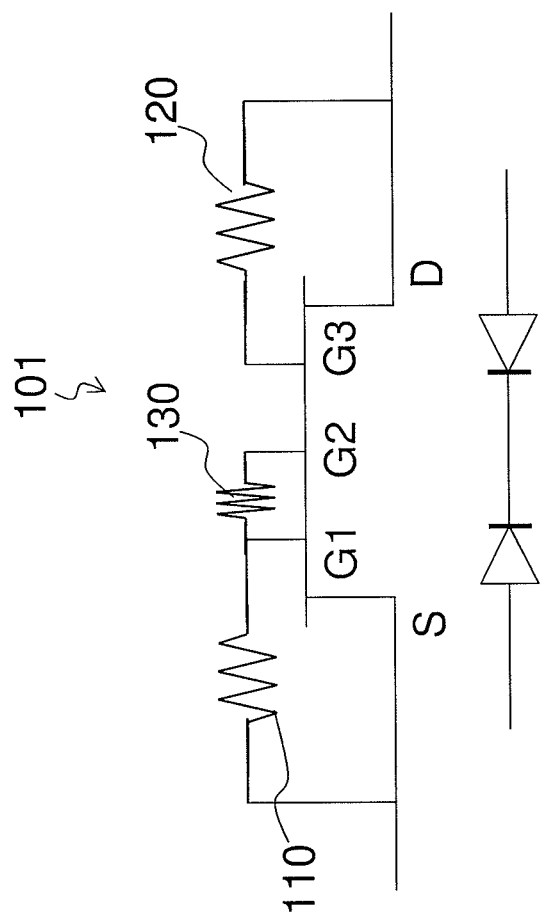
Figure 1D:
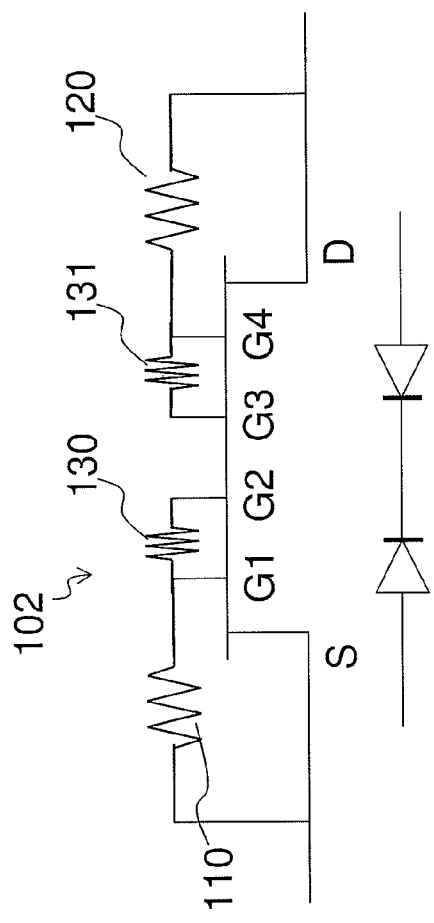
Figure 1E:
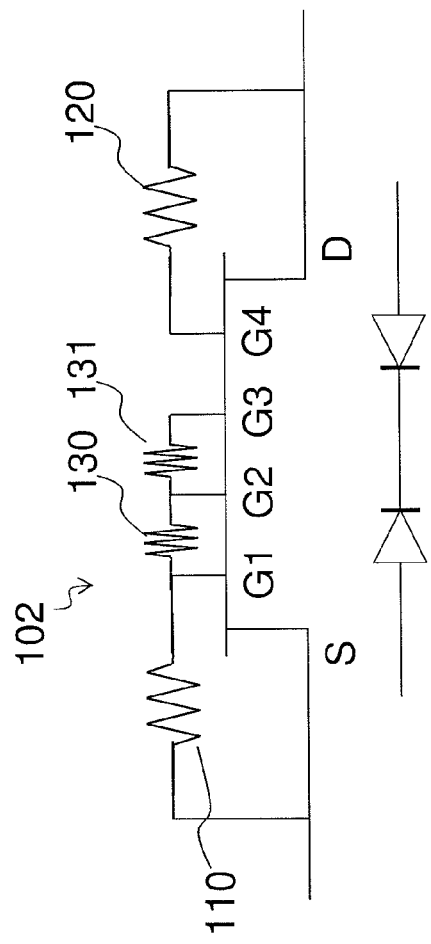

FIGS. 1A and 1B are circuit diagrams showing embodiments of the type I compound semiconductor ESD protection device using a dual-gate E-FET 100 provided by the present invention. In FIG. 1A, the source electrode S is connected to the gate electrode G1 through the first resistor 110, and the drain electrode D is connected to the gate electrode G2 through the second resistor 120. In FIG. 1B, the connections shown in FIG. 1A are over crossed: the source electrode S is connected to the distant gate electrode G2 instead through the first resistor 110, and the drain electrode D is connected to the gate electrode G1 instead through the second resistor 120. FIG. 1C is a circuit diagram showing an embodiment of the type I compound semiconductor ESD protection device using a triple-gate E-FET 101 provided by the present invention. The source electrode S is connected to the gate electrodes G1 through the first resistor 110, and to the gate electrodes G2 through the first resistor 110 and the third resistor 130. The drain electrode D is connected to the gate electrode G3 through the second resistor 120. FIGS. 1D and 1E are circuit diagrams showing embodiments of the type I compound semiconductor ESD protection device using a quadruple-gate E-FET 102 provided by the present invention. In FIG. 1D, the source electrode S is connected to the gate electrodes G1 through the first resistor 110, and to the gate electrodes G2 through the first resistor 110 and the third resistor 130. The drain electrode D is connected to the gate electrode G4 through the second resistor 120, and to the gate electrode G3 through the second resistor 120 and the third resistor 131. In FIG. 1E, the source electrode S is connected to the gate electrodes G1 through the first resistor 110, to the gate electrodes G2 through the first resistor 110 and the third resistor 130, and to the gate electrodes G3 through the first resistor 110 and the third resistor 130 and 131. The drain electrode D is connected to the gate electrode G4 through the second resistor 120.

Figure 2A:
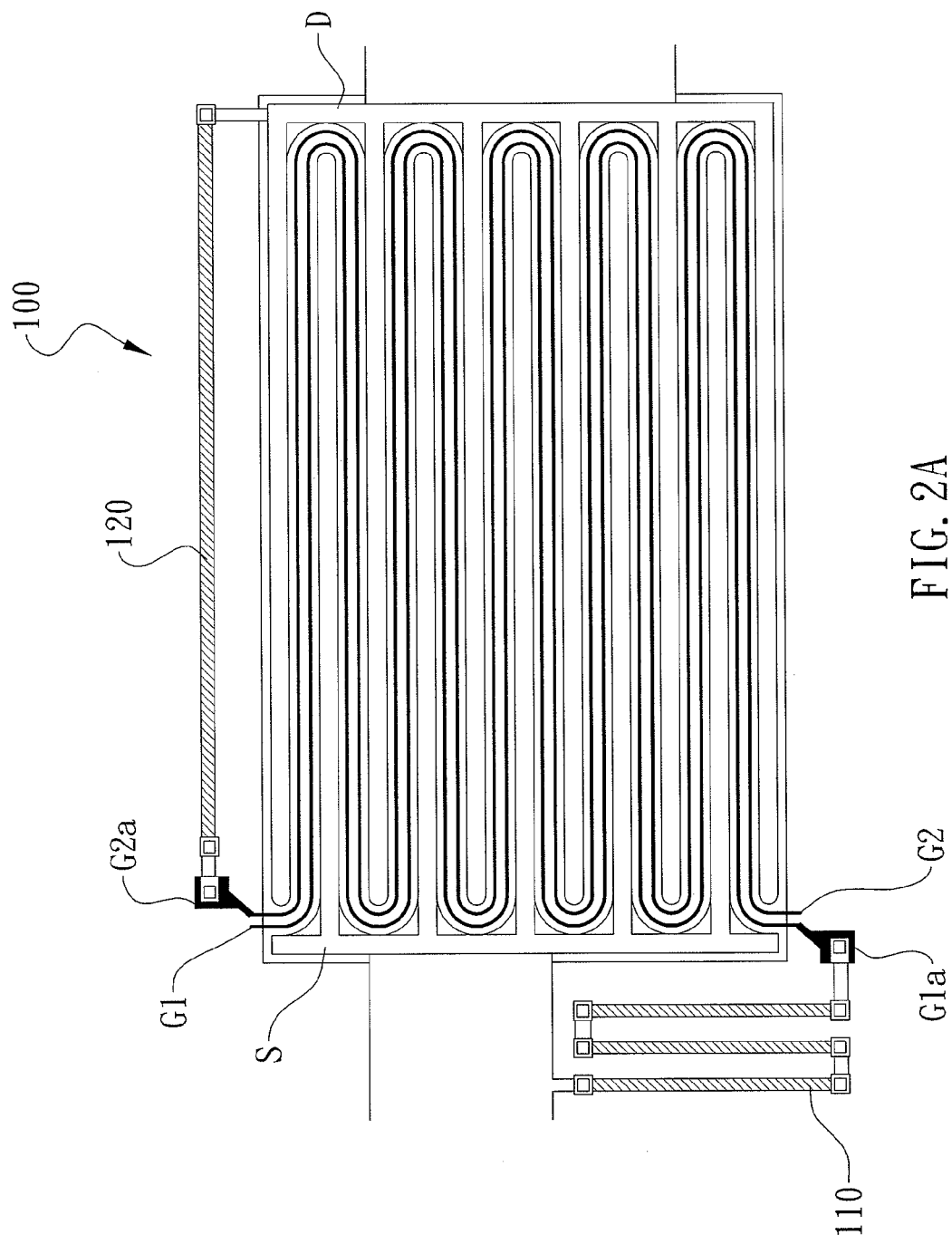
FIG. 2A~2D are schematics showing the plan view of embodiments of the circuit diagrams shown in FIG. 1A~1C provided by the present invention.

An implementation of the circuit diagram shown in FIG. 1A is shown in FIG. 2A. In this implementation, the source electrode S and the drain electrode D are multi-finger electrodes with their fingers interposed each other. The dual gates electrodes are meandering gate electrodes disposed on the space between each pair of the source and drain electrode fingers. An electrode pad wider than the width of a gate electrode may be disposed at the end of each of the gate electrodes for the electrical connection to other electrical elements. In this implementation, gate electrode pads G1*a* and G2a are disposed at one end of gate electrodes G1 and G2, respectively. The first resistor 110 is connected to the gate electrode pad G1a and the source electrode S. The second resistor 120 is connected to the gate electrode pad G2a and the drain electrode D.

Figure 2B:
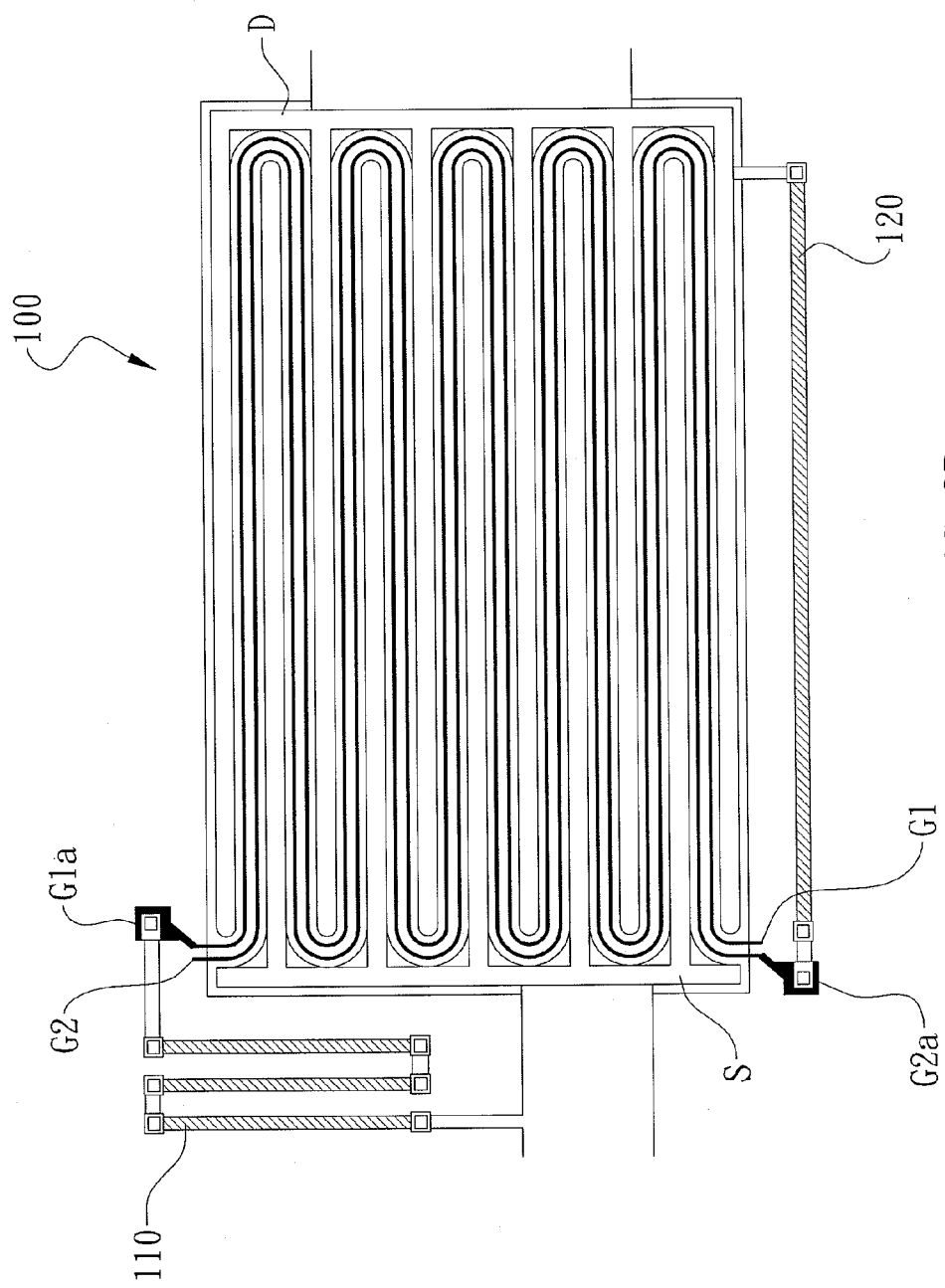
Figure 2C:
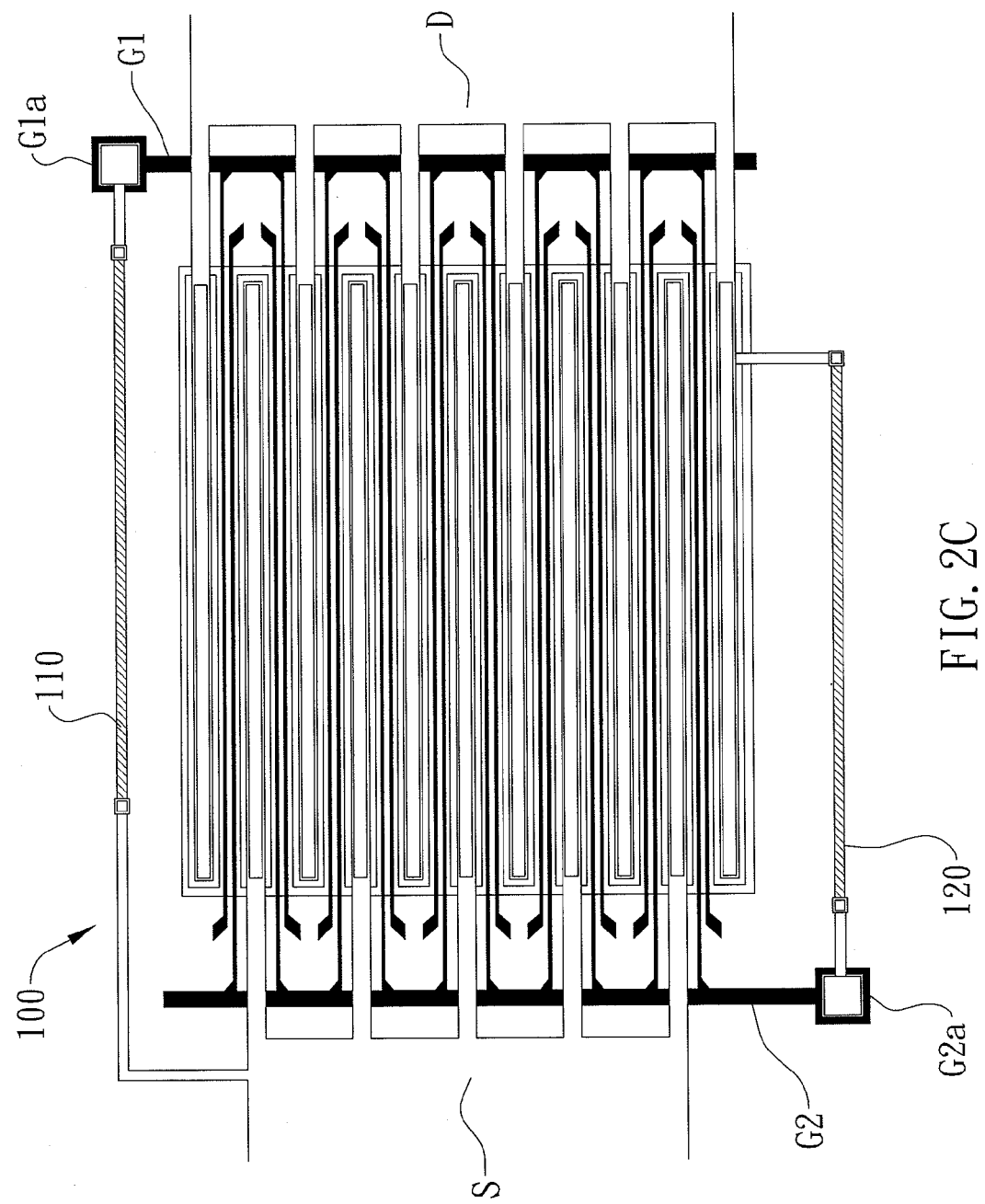

FIG. 2B shows an implementation of the circuit diagram shown in FIG. 1B, which has the similar scheme to the implementation shown in FIG. 2A. FIG. 2C shows another implementation of the circuit diagram shown in FIG. 1B. The source electrode S and the drain electrode D are multi-finger electrodes with their fingers interposed each other. The dual gates electrodes G1 and G2 are multi-finger electrodes interposed each other disposed between each pair of a source and a drain electrode fingers. The gate electrode pads G1a and G2a are provided at one end of the gate electrodes G1 and G2, respectively. The first resistor 110 is connected to the gate electrode pad G2a and the source electrode S. The second resistor 120 is connected to the gate electrode pad G1a and the drain electrode D.

Figure 2D:
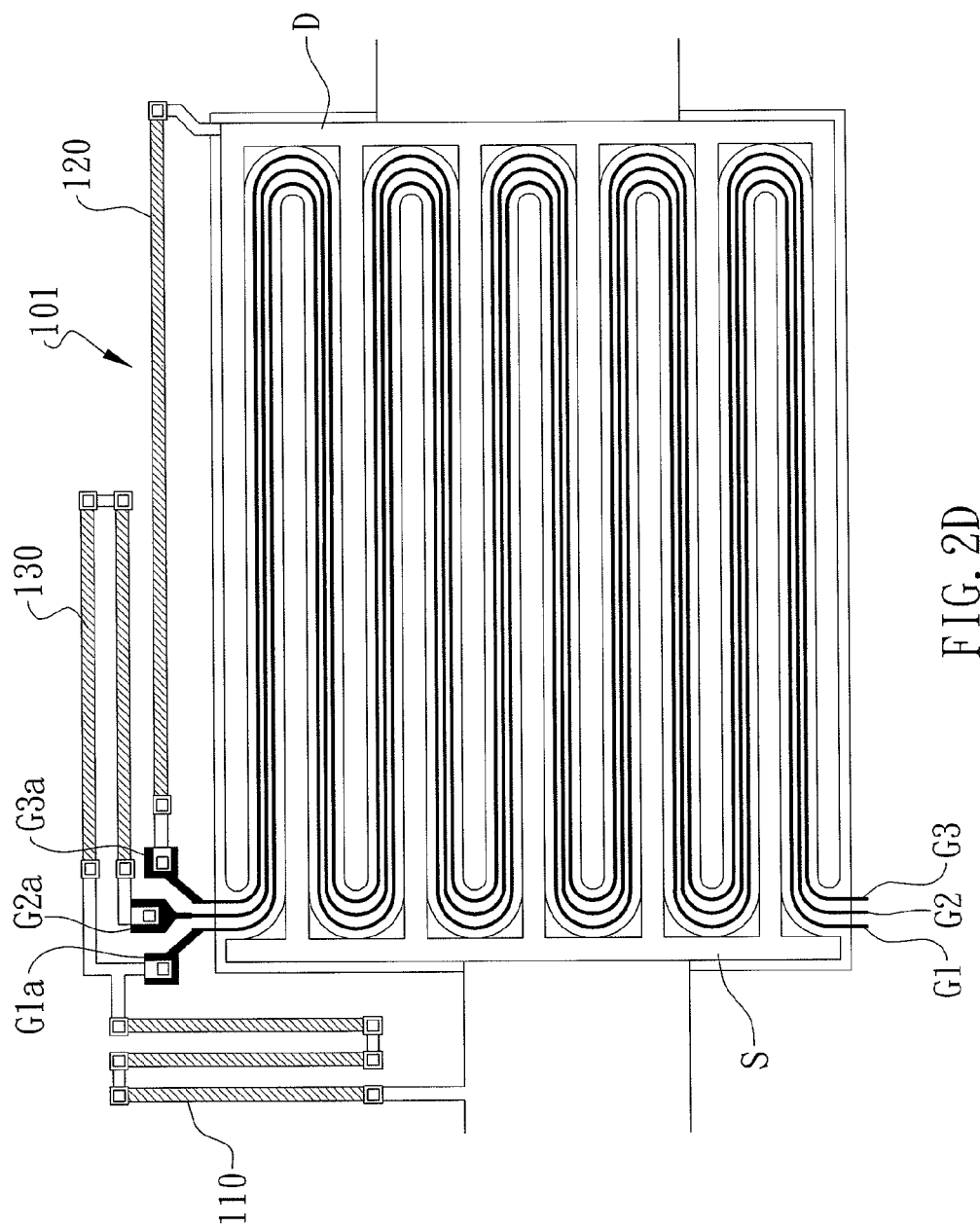

FIG. 2D shows an implementation of the circuit diagram shown in FIG. 1C, which has the similar scheme to the implementation shown in FIG. 2A, except that the E-FET is a triple-gate E-FET. Gate electrode pads G1a, G2a, and G3a are disposed at one end of the gate electrodes G1, G2, and G3, respectively. The first resistor 110 is connected to the gate electrode pad G1a and the source electrode S. The second resistor 120 is connected to the gate electrode pad G3a and the drain electrode D. The third resistor 130 is connected between the gate electrode pads G1a and G2a.

Type II ESD Compound Semiconductor Protection Device

FIG. 3A~3N are circuit diagrams showing embodiments of the type II compound semiconductor ESD protection device provided by the present invention. An equivalent circuit of diodes is provided at the bottom of each figure. The type II compound semiconductor ESD protection device comprises a multi-gate E-FET (100~102) and at least one fourth resistor (140~143). The multi-gate E-FET comprises a source electrode S, a drain electrode D, and plural gate electrodes (G1~G4) disposed between the source and drain electrodes. At least one of the plural gate electrodes are connected to at least one of the inter-gate regions between two adjacent gate electrodes through the at least one fourth resistor. In these embodiments, the type II ESD compound semiconductor protection device may further include one or more fifth resistors (150 and 151) connecting at least one of the plural gate electrodes to the source or drain electrodes. Moreover, the type II ESD compound semiconductor protection device may further include one or more sixth resistors (160 and 161) connecting two gate electrodes, so that a gate electrode can be connected indirectly through the one or more sixth resistors and a fourth or a fifth resistor to the source electrode, the drain electrode, or an inter-gate regions between two adjacent gate electrodes.

FIGS. 3A and 3B are circuit diagrams showing embodiments of the type II compound semiconductor ESD protection device using a dual-gate E-FET 100 provided by the present invention. In FIG. 3A, the gate electrode G1 is connected to the source electrode S through the fifth resistor 150, and the gate electrode G2 is connected to a connection node C1 disposed on the inter-gate region between gate electrodes G1 and G2 through the fourth resistor 140. In FIG. 3B, both gate electrodes G1 and G2 are connected to a connection node C1 disposed on the inter-gate region between gate electrodes G1 and G2 through the fourth resistors 140 and 141, respectively.

Figure 3G:
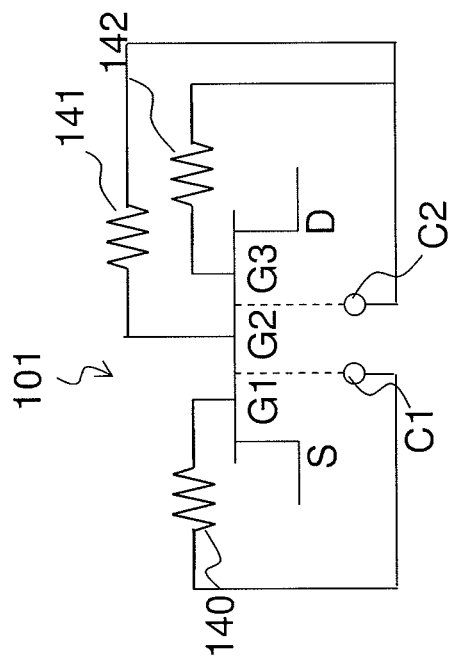
FIG. 3A~3N are circuit diagrams showing embodiments of the type II compound semiconductor ESD protection device provided by the present invention.
Figure 3F:
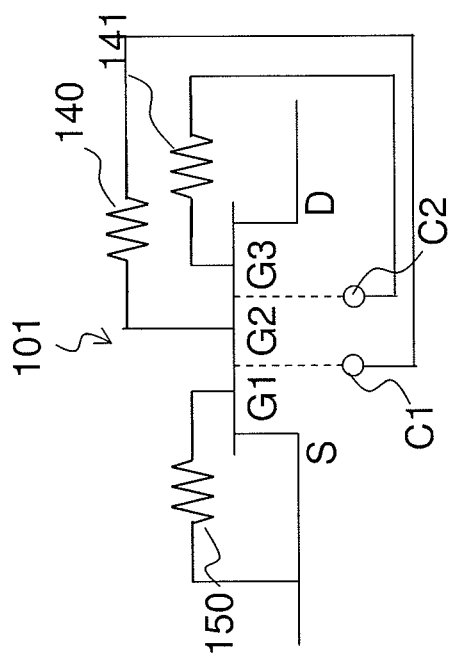

FIG. 3C~3G are circuit diagrams showing embodiments of the type II compound semiconductor ESD protection device using a triple-gate E-FET 101 provided by the present invention. In FIG. 3C, the gate electrode G1 is connected to the source electrode S through the fifth resistor 150, the gate electrode G3 is connected to the drain electrode D through the fifth resistor 151, and the gate electrode G2 is connected to a connection node C1 disposed on the inter-gate region between gate electrodes G1 and G2 through the fourth resistor 140. In FIG. 3D, both gate electrodes G2 and G3 are connected to a connection node C2 disposed on the inter-gate region between gate electrodes G2 and G3 through the fourth resistors 140 and 141, respectively, and the gate electrode G1 is connected to the connection node C2 through the sixth resistor 160 and the fourth resistor 140. In FIG. 3E, the gate electrode G1 is connected to the source electrode S through the fifth resistor 150, the gate electrode G2 is connected to the source electrode S through the fifth resistor 150 and the sixth resistor 160, and the gate electrode G3 is connected to a connection node C2 disposed on the inter-gate region between gate electrodes G2 and G3 through the fourth resistor 140. In FIG. 3F, the gate electrode G1 is connected to the source electrode through the fifth resistor 150, the gate electrode G2 is connected to a connection node C1 disposed on the inter-gate region between gate electrodes G1 and G2 through the fourth resistor 140, and the gate electrode G3 is connected to a connection node C2 disposed on the inter-gate region between gate electrodes G2 and G3 through the fourth resistor 141. In FIG. 3G, the gate electrode G1 is connected to a connection node C1 disposed on the inter-gate region between gate electrodes G1 and G2 through the fourth resistor 140, and gate electrodes G2 and G3 are connected to a connection node C2 disposed on the inter-gate region between gate electrodes G2 and G3 through the fourth resistors 141 and 142, respectively.

Figure 3H:
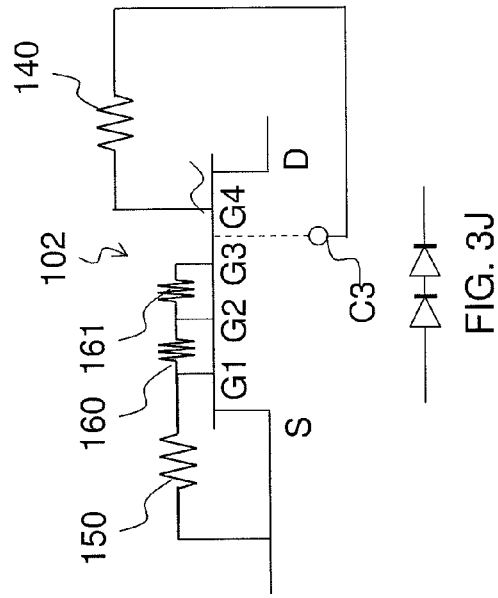
Figure 3J:
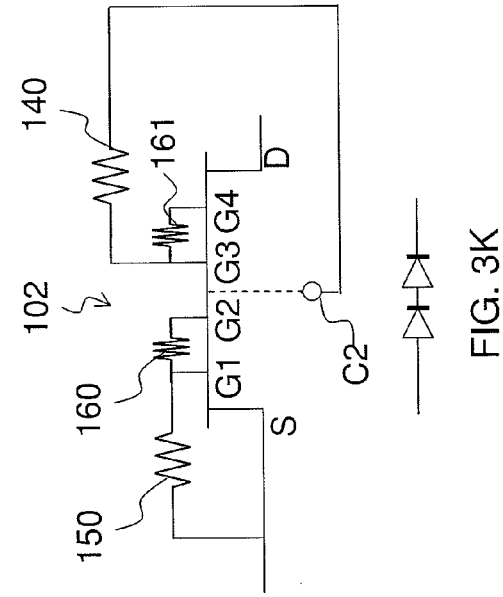
Figure 3I:
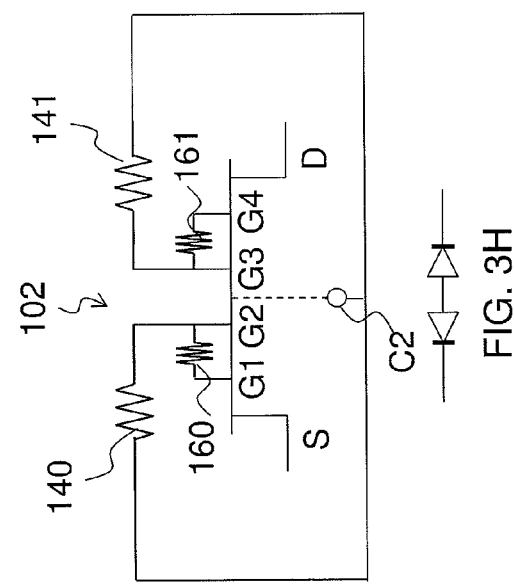
Figure 3K:
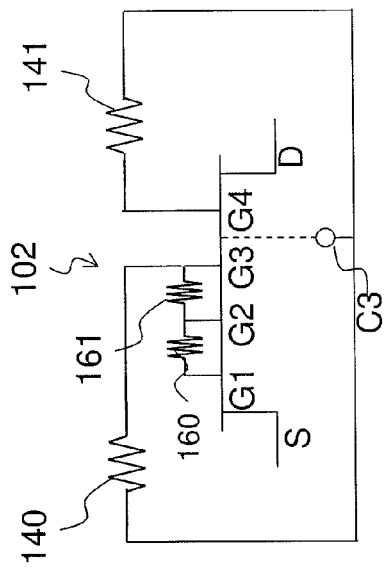

FIG. 3H-3N are circuit diagrams showing embodiments of the type II compound semiconductor ESD protection device using a quadruple-gate E-FET 102 provided by the present invention. In FIG. 3H, gate electrodes G2 and G3 are connected to a connection node C2 disposed on the inter-gate region between gate electrodes G2 and G3 through the fourth resistors 140 and 141, respectively, and gate electrodes G1 and G4 are connected to the connection node C2 by connecting to gate electrodes G2 and G3 through the sixth resistors 160 and 161, respectively. In FIG. 3I, gate electrodes G3 and G4 are connected to a connection node C3 disposed on the inter-gate region between gate electrodes G3 and G4 through the fourth resistors 140 and 141, respectively, and gate electrodes G1 and G2 are connected to the connection node C3 by connecting to the gate electrode G3 through the sixth resistors 160 and 161 and through the sixth resistor 161, respectively. In FIG. 3J, the gate electrode G1 is connected to the source electrode S through the fifth resistor 150, gate electrodes G2 and G3 are connected to the source electrode S by connecting to gate electrode G1 through the sixth resistor 160 and through the sixth resistors 160 and 161, respectively, and the gate electrode G4 is connected to a connection node C3 disposed on the inter-gate region between gate electrodes G3 and G4 through the fourth resistor 140. In FIG. 3K, the gate electrode G1 is connected to the source electrode S through the fifth resistor 150, the gate electrode G2 is connected to the source electrode S by connecting to the gate electrode G1 through the sixth resistor 160, the gate electrode G3 is connected to a connection node C2 disposed on the inter-gate region between gate electrodes G2 and G3 through the fourth resistor 140, and the gate electrode G4 is connected to the connection node C2 by connecting to the gate electrode G3 through the sixth resistor 161. In FIG. 3L, the gate electrodes G1 is connected to a connection node C1 disposed on the inter-gate region between gate electrodes G1 and G2 through the fourth resistor 140, the gate electrodes G2 and G3 are connected to a connection node C2 disposed on the inter-gate region between gate electrodes G2 and G3 through the fourth resistor 141 and 142, respectively, and the gate electrode G4 is connected to a connection node C3 disposed on the inter-gate region between gate electrodes G3 and G4 through the fourth resistor 143. In FIG. 3M, the gate electrode G1 is connected to the source electrode S through the fifth resistor 150, the gate electrode G2 is connected to a connection node C1 disposed on the inter-gate region between gate electrodes G1 and G2 through the fourth resistor 140, the gate electrode G3 is connected to a connection node C2 disposed on the inter-gate region between gate electrodes G2 and G3 through the fourth resistor 141, and the gate electrode G4 is connected to a connection node C3 disposed on the inter-gate region between gate electrodes G3 and G4 through the fourth resistor 142. In FIG. 3N, the gate electrodes G1 is connected to the source electrode S through the fifth resistor 150, the gate electrode G2 is connected to the source electrode S by connecting to the gate electrode G1 through the sixth resistor 160, the gate electrode G3 is connected to a connection node C2 disposed on the inter-gate region between gate electrodes G2 and G3 through the fourth resistor 140, and the gate electrode G4 is connected to a connection node C3 disposed on the inter-gate region between gate electrodes G3 and G4 through the fourth resistor 141.

FIG. 4A~4K show the various implementations of the circuit diagrams selected from FIG. 3A~3N. The scheme of the implementations are similar to that of the implementations of the type I compound semiconductor ESD protection device shown in FIG. 2A, in which the source electrode S and the drain electrode D are multi-finger electrodes with their fingers interposed each other, and the multi-gate electrodes are meandering gate electrodes disposed on the space between each pair of the source and drain electrode fingers. An electrode pad wider than the width of a gate electrode is provided at the end of each of the gate electrodes for the electrical connection to other electrical elements.

Figure 4A:
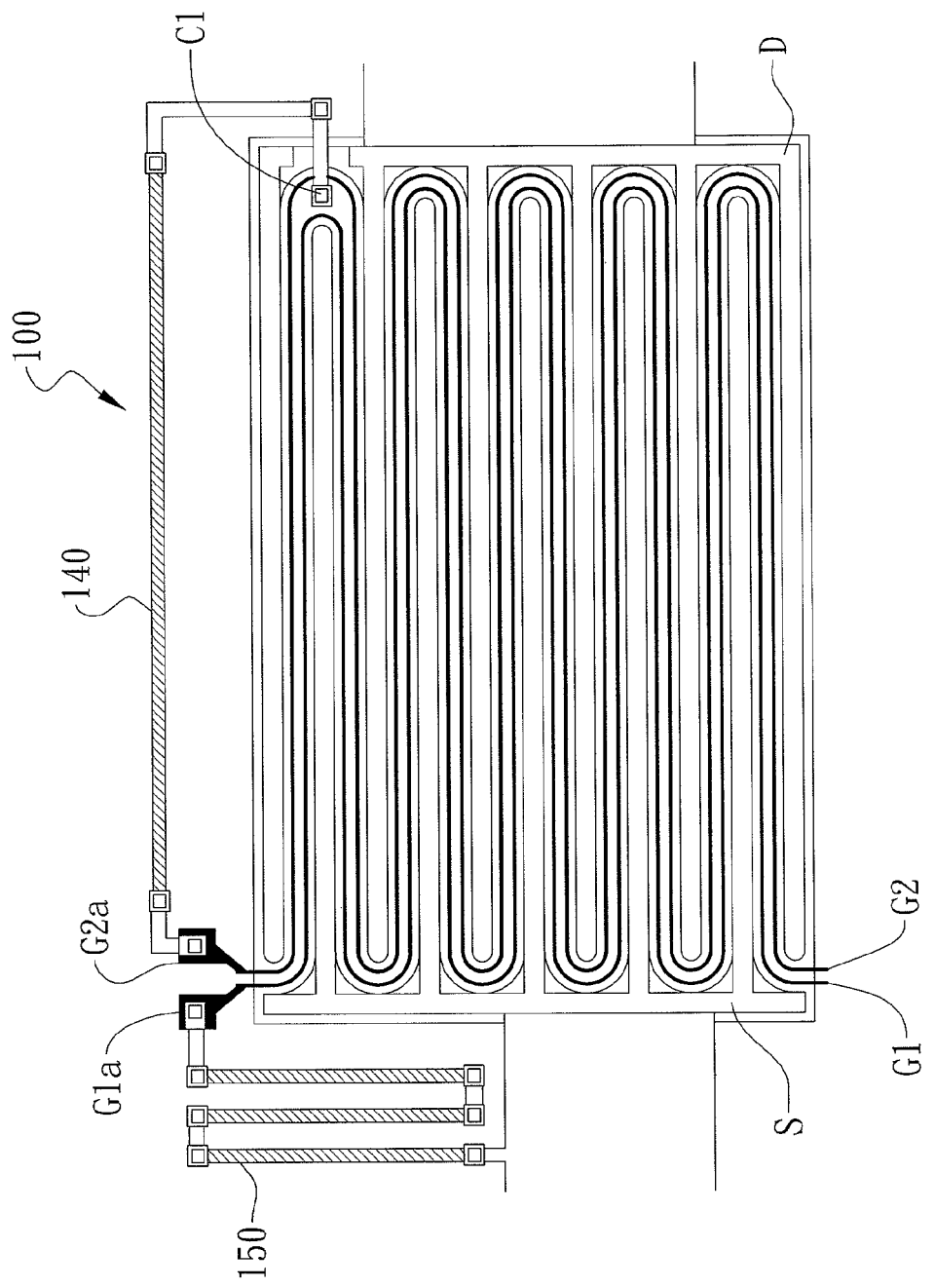
FIG. 4A~4K are schematics showing the plan view of embodiments of the circuit diagrams selected from those shown in FIG. 3A~3N provided by the present invention.
Figure 4B:
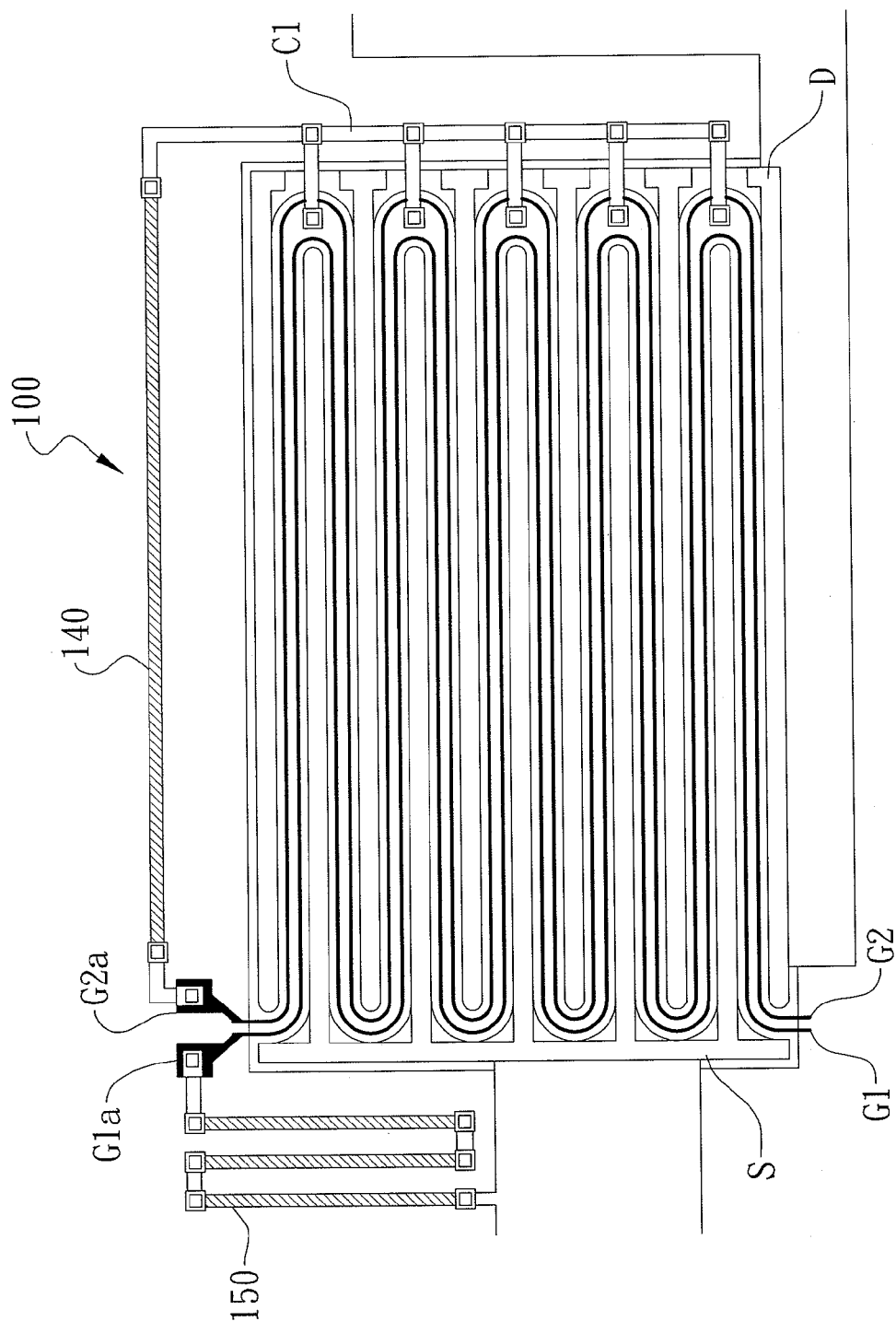

FIGS. 4A and 4B show two implementations of the circuit diagram of FIG. 3A. Gate electrode pads G1a and G2a are disposed at one ends of the gate electrodes G1 and G2, respectively. The connection node C1 is disposed on a turning region of the meandering gate electrodes which is made wider between gate electrodes G1 and G2. The inter-gate space can also be made wider between gate electrodes G1 and G2 at more than one of the turning regions of the meandering gate electrodes to facilitate the installation of multiple connection nodes for electrical connection on the inter-gate region, as shown in FIG. 4B. The fourth resistor 140 is connected between the gate electrode pad G2a and the connection node C1. The fifth resistor 150 is connected between the gate electrode pad G1a and the source electrode S.

Figure 4C:
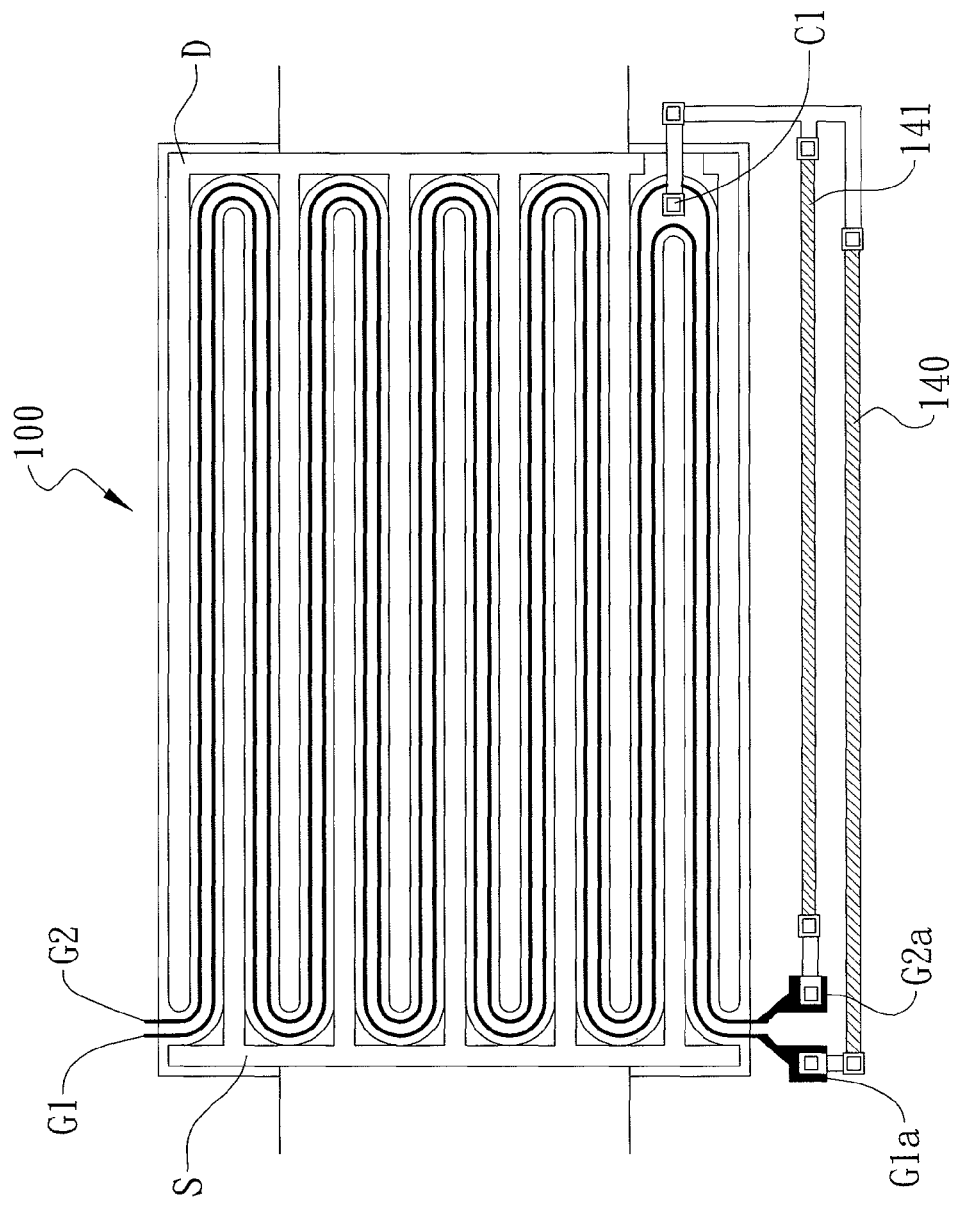
Figure 4D:
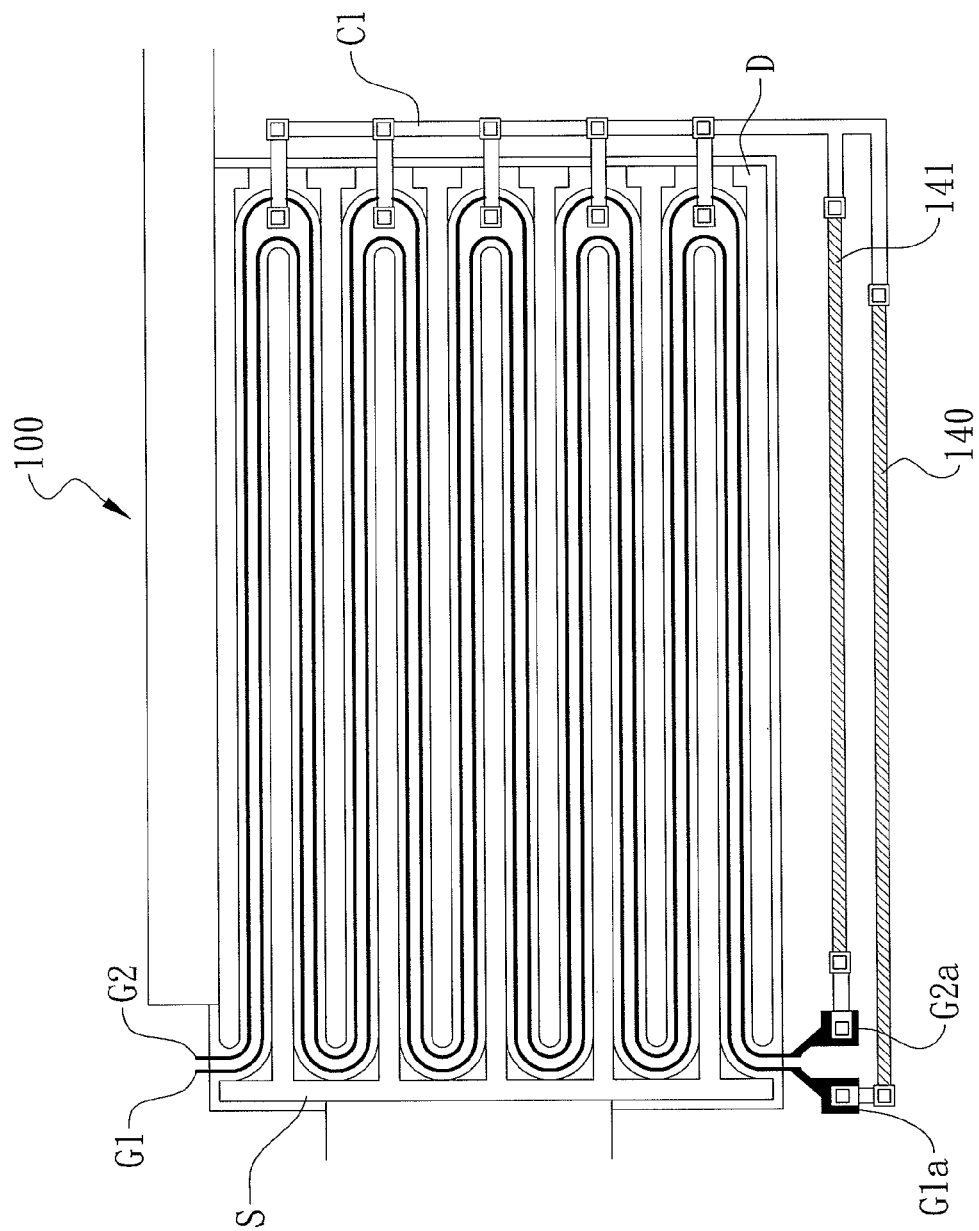

FIGS. 4C and 4D show two implementations of the circuit diagram shown in FIG. 3B. Gate electrode pads G1a and G2a are disposed at one ends of the gate electrodes G1 and G2, respectively. The connection node C1 on the inter-gate region between gate electrodes G1 and G2 can be disposed on one or more than one turning regions of the meandering gate electrodes which are made wider between gate electrodes G1 and G2, same as the implementations shown in FIGS. 4A and 4B. The fourth resistor 140 is connected between the gate electrode pad G1a and the connection node C1, and the fourth resistor 141 is connected between the gate electrode pad G2a and the connection node C1.

Figure 4E:
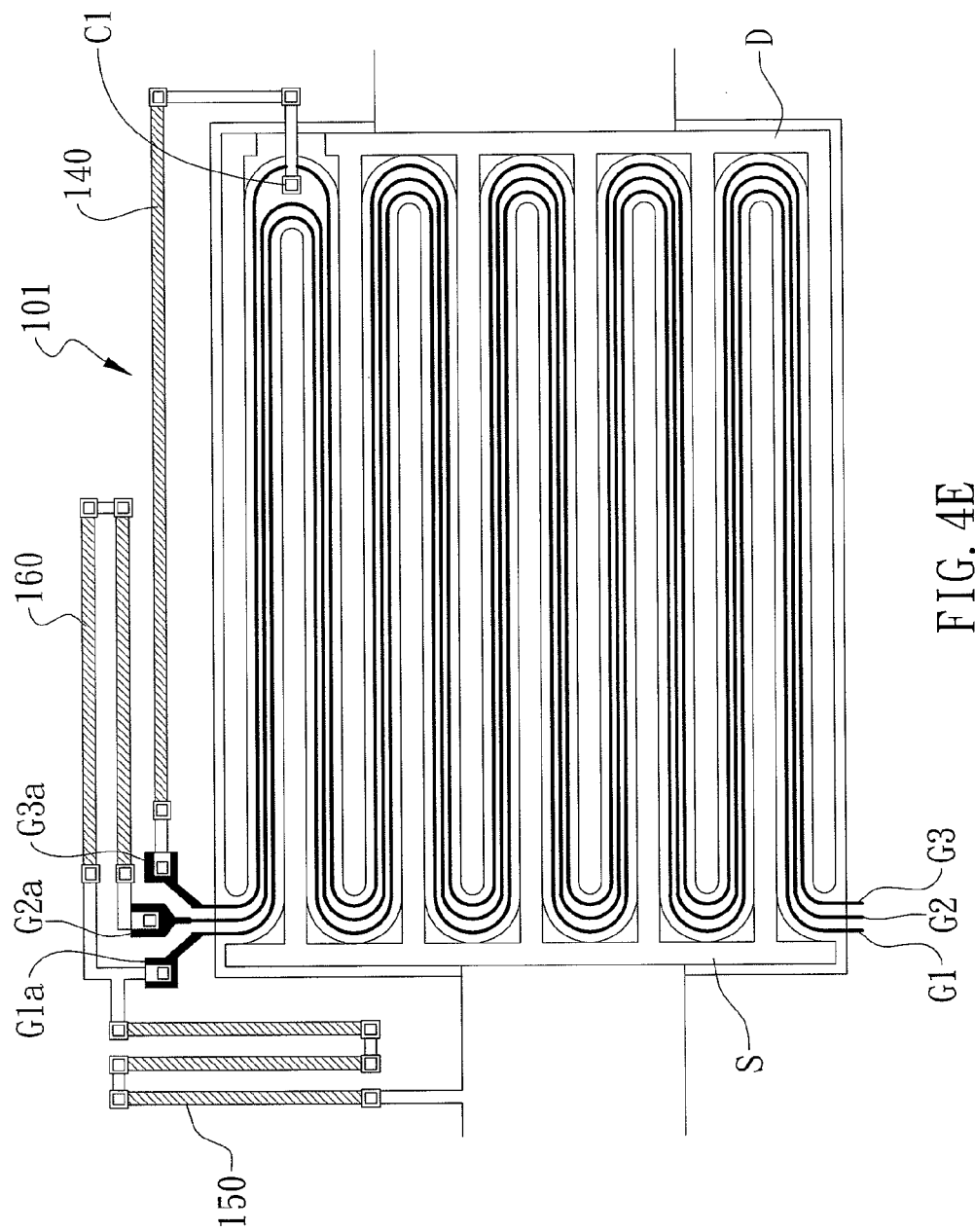

FIG. 4E shows an implementation of the circuit diagram shown in FIG. 3E. Gate electrode pads G1a, G2a and G3a are disposed at one ends of the gate electrodes G1, G2, and G3, respectively. The connection node C2 is disposed on a turning region of the meandering gate electrodes which is made wider between gate electrodes G2 and G3. The fourth resistor 140 is connected between the gate electrode pad G3a and the connection node C2, the fifth resistor 150 is connected between the gate electrode pad G1a and the source electrode S, and the sixth resistor 160 is connected between the gate electrode pads G1a and G2a.

Figure 4F:
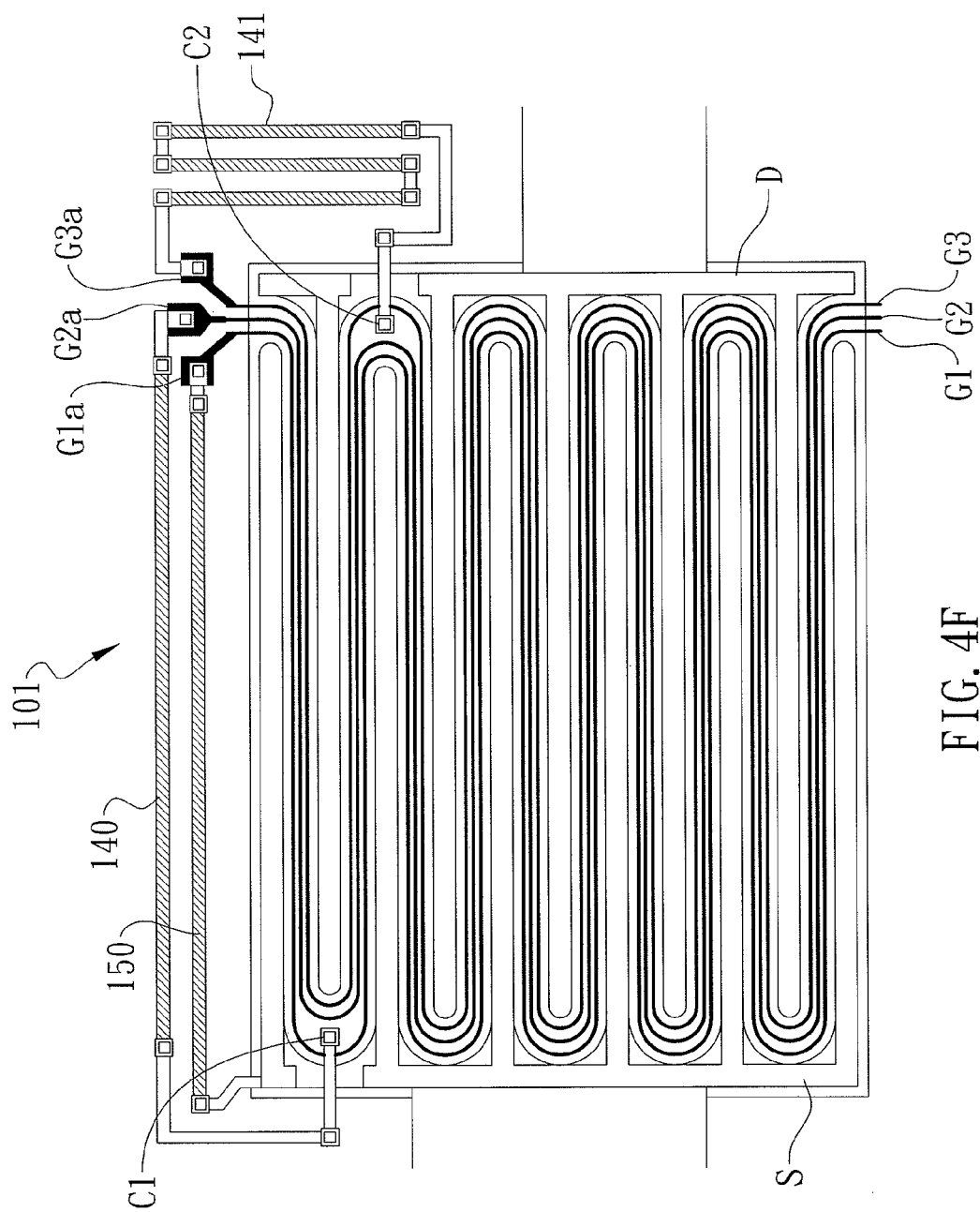
Figure 4G:
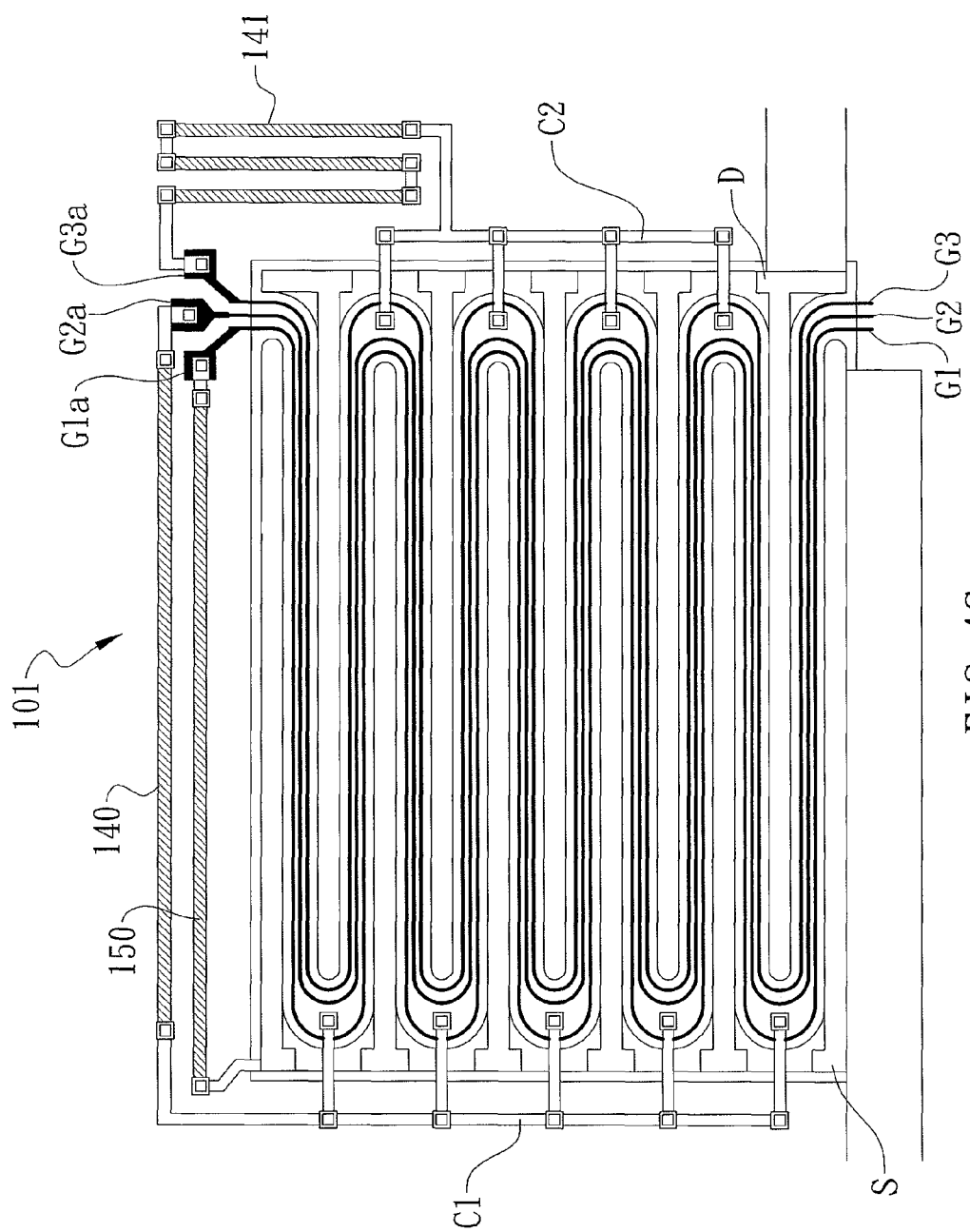

FIGS. 4F and 4G show two implementations of the circuit diagram shown in FIG. 3F. Gate electrode pads G1a, G2a and G3a are disposed at one ends of the gate electrodes G1, G2, and G3, respectively. The connection node C1 can be disposed on one or more than one turning regions of the meandering gate electrodes which are made wider between gate electrodes G1 and G2, and the connection node C2 can also be disposed on one or more than one turning regions of the meandering gate electrodes which are made wider between gate electrodes G2 and G3. The fourth resistor 140 is connected between the gate electrode pad G2a and the connection node C1, the fourth resistor 141 is connected between the gate electrode pad G3a and the connection node C2, and the fifth resistor 150 is connected between the gate electrode pad G1a and the source electrode S.

Figure 4H:
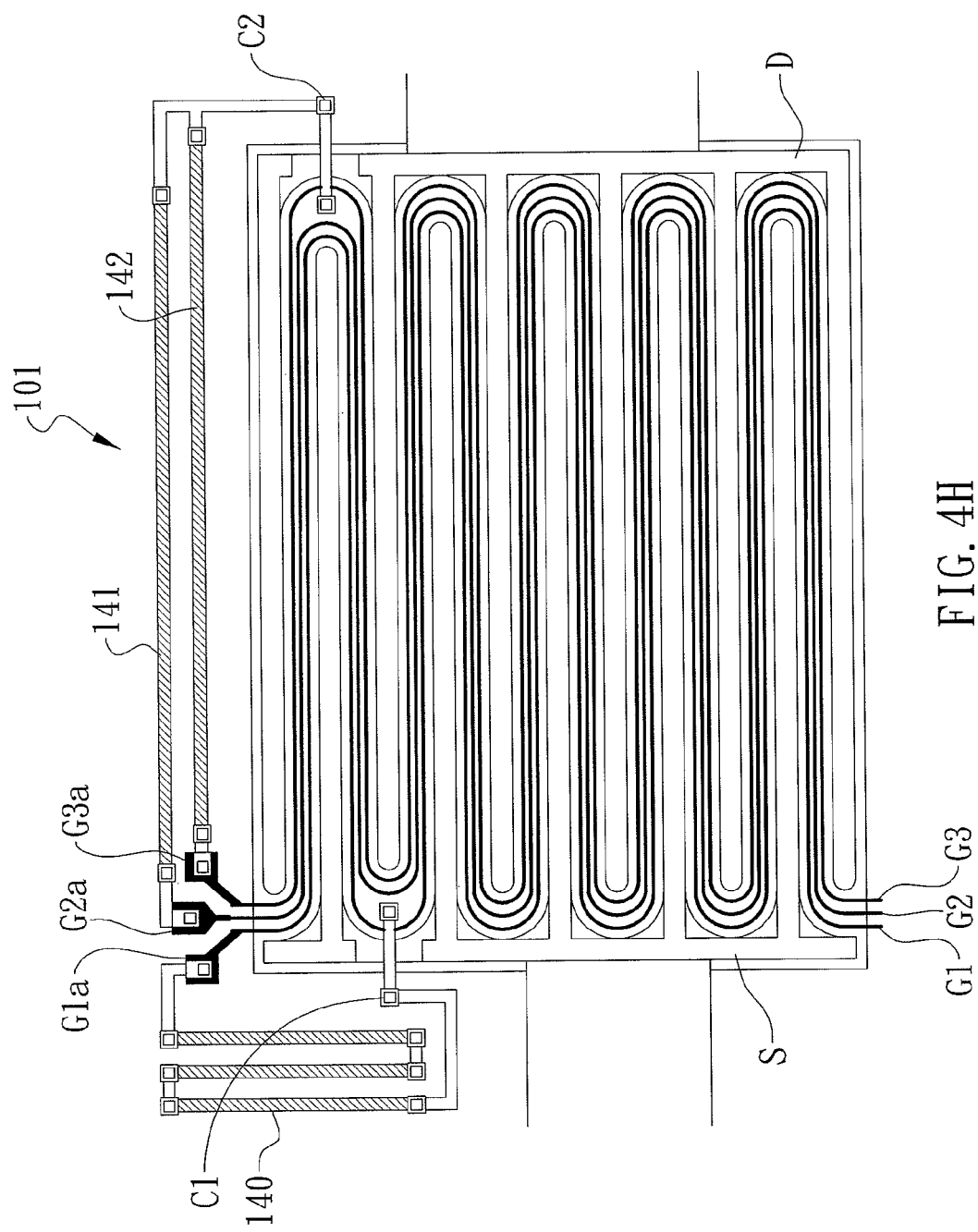
Figure 4I:
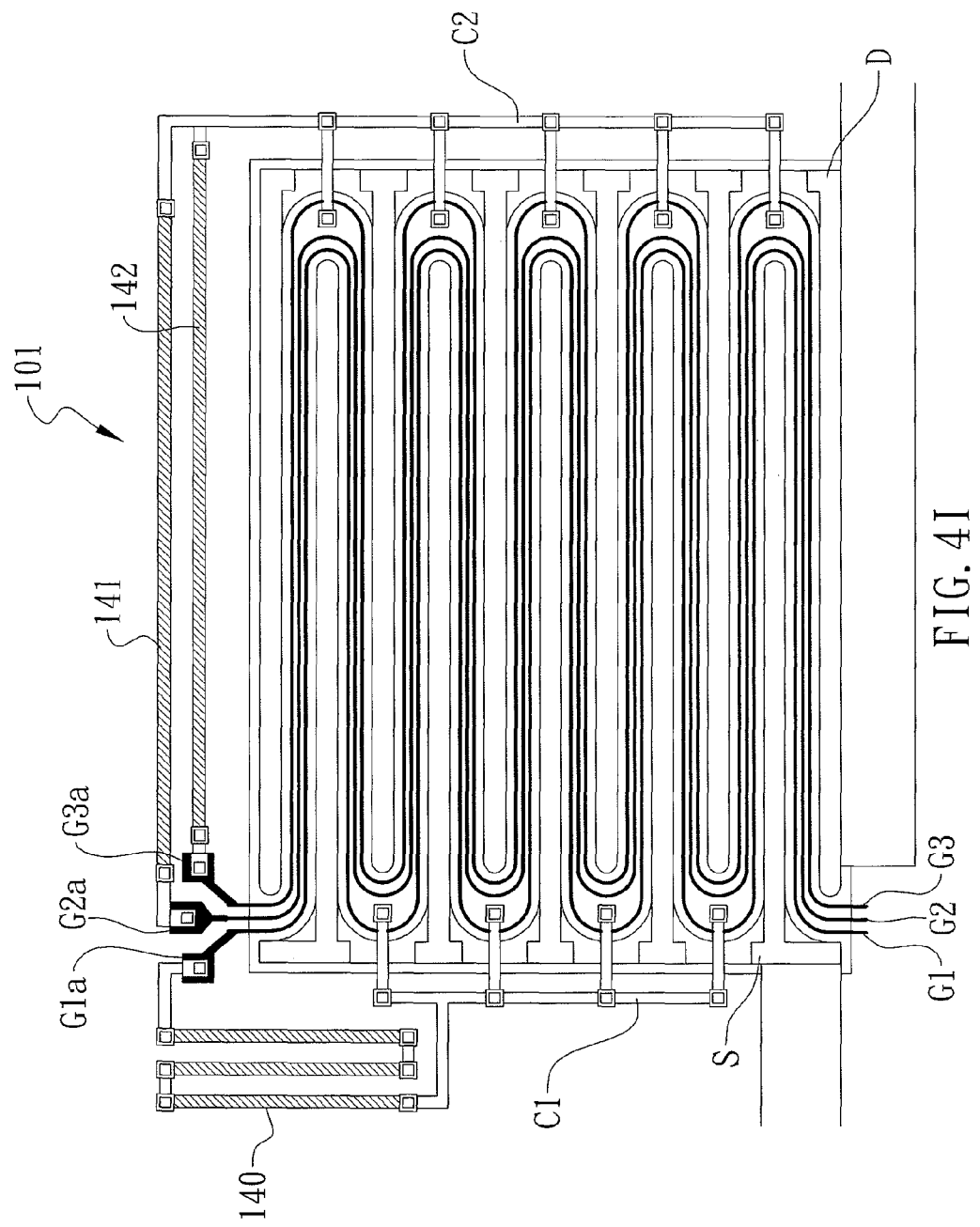

FIGS. 4H and 4I show two implementations of the circuit diagram shown in FIG. 3G. Gate electrode pads G1a, G2a and G3a are disposed at one ends of the gate electrodes G1, G2, and G3, respectively. The connection node C1 is disposed on one or more than one turning regions of the meandering gate electrodes which are made wider between gate electrodes G1 and G2, and the connection node C2 is disposed on one or more than one turning regions of the meandering gate electrodes which are made wider between gate electrodes G2 and G3. The fourth resistor 140 is connected between the gate electrode pad G1a and the connection node C1, and the fourth resistor 141 and 142 are connected between the connection node C2 and the gate electrode pad G2a and G3a, respectively.

Figure 4J:
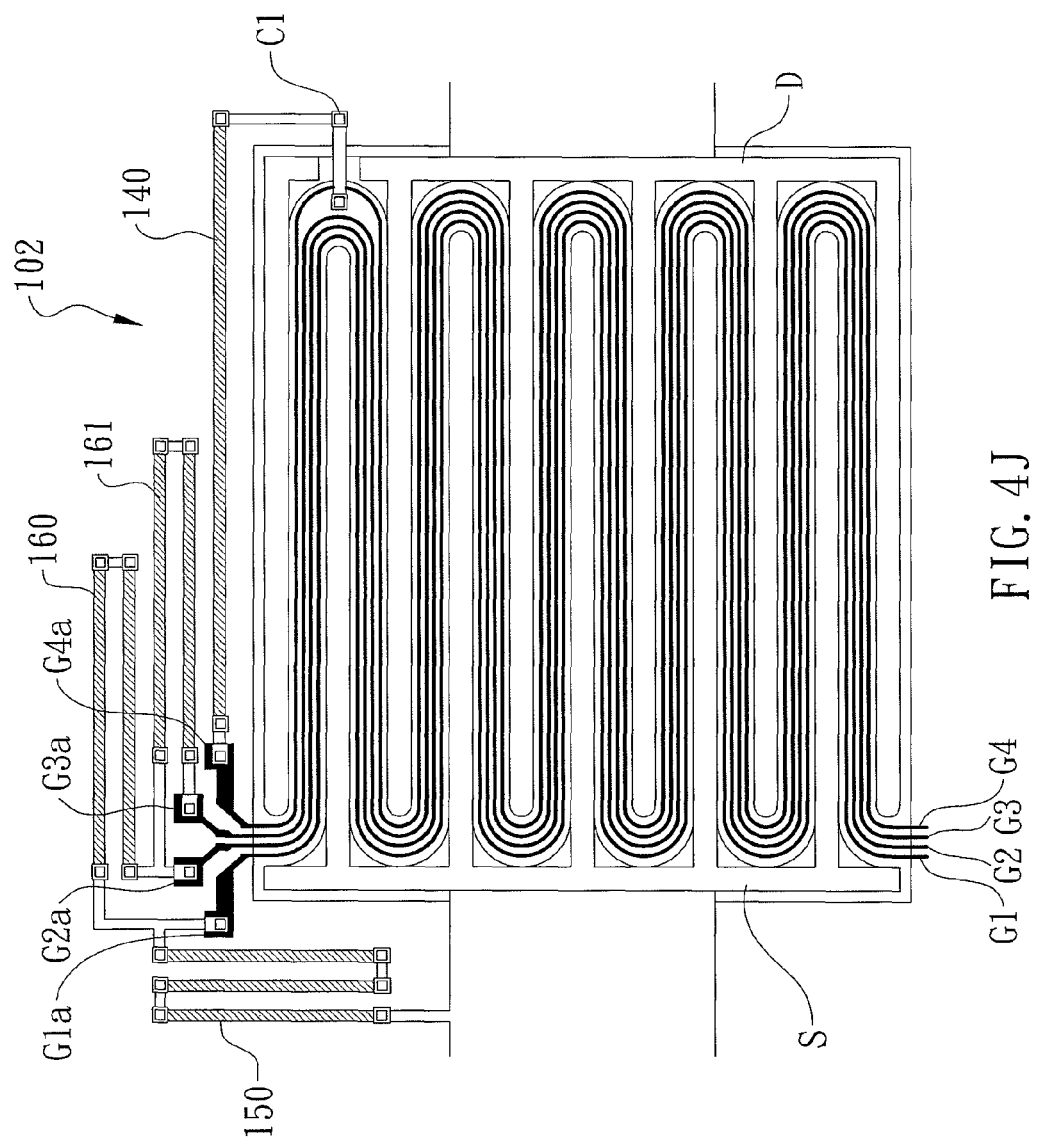

FIG. 4J shows an implementation of the circuit diagram shown in FIG. 3J. Gate electrode pads G1a, G2a, G3a, and G4a are disposed at one ends of the gate electrodes G1, G2, G3, and G4, respectively. The connection node C3 is disposed on a turning region of the meandering gate electrodes which is made wider between gate electrodes G3 and G4. The fourth resistor 140 is connected between the gate electrode pad G4a and the connection node C3, the fifth resistor 150 is connected between the gate electrode pad G1a and the source electrode S, the sixth resistor 160 is connected between the gate electrode pads G1a and G2a, and the sixth resistor 161 is connected between the gate electrode pads G2a and G3a.

Figure 4K:
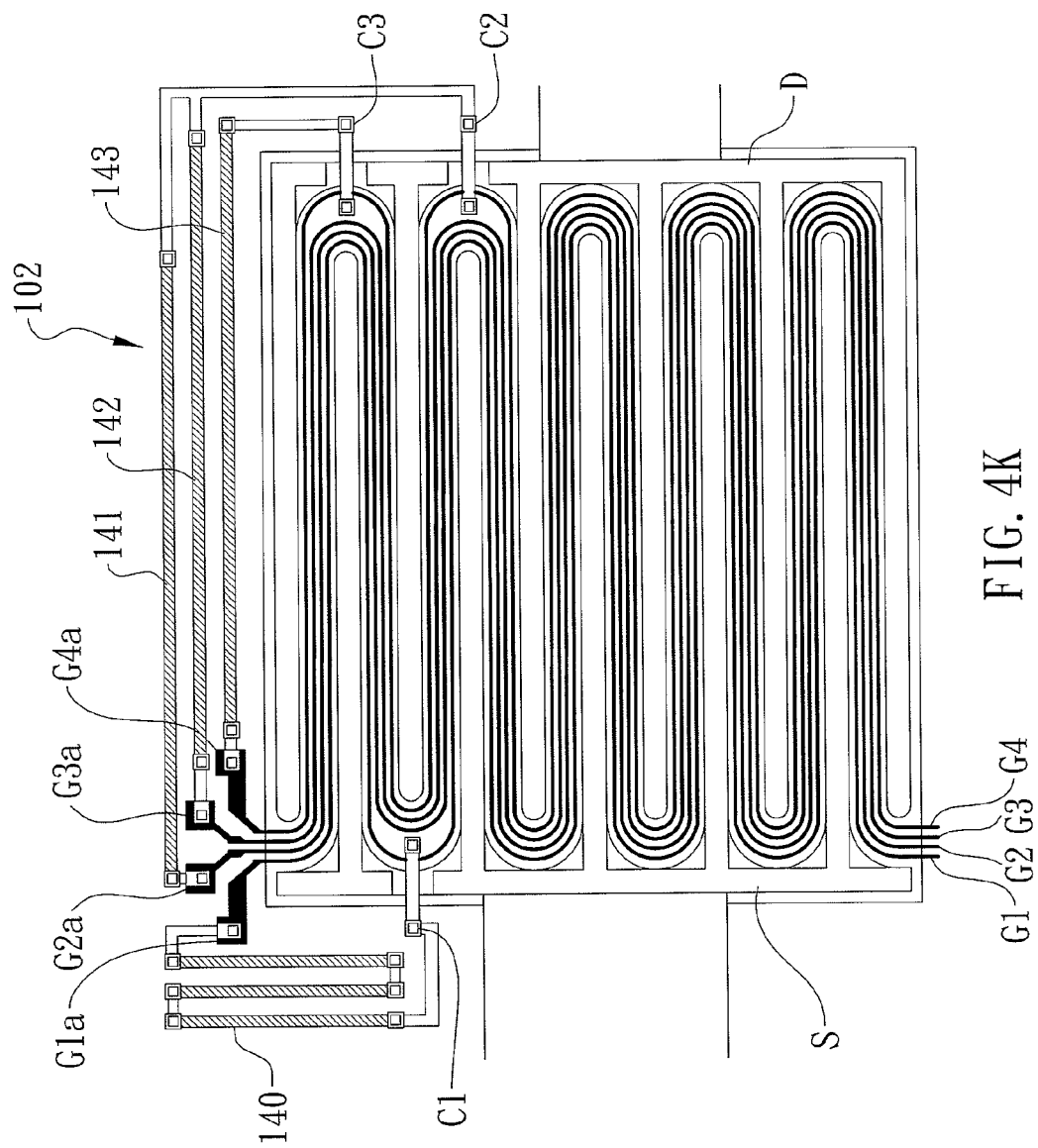

FIG. 4K shows an implementation of the circuit diagram shown in FIG. 3L. Gate electrode pads G1a, G2a, G3a, and G4a are disposed at one ends of the gate electrodes G1, G2, G3, and G4, respectively. The connection nodes C1, C2, and C3 are disposed on a turning region of the meandering gate electrodes which is made wider between gate electrodes G1 and G2, between gate electrodes G2 and G3, between gate electrodes G3 and G4, respectively. The fourth resistor 140, 141, 142, and 143 are connected between the gate electrode pad G1a and the connection node C1, between the gate electrode pad G2a and the connection node C2, between the gate electrode pad G3a and the connection node C2, and between the gate electrode pad G4a and the connection node C3, respectively.

Type III Compound Semiconductor ESD Protection Device

Figures 5A, 5B, 5C:
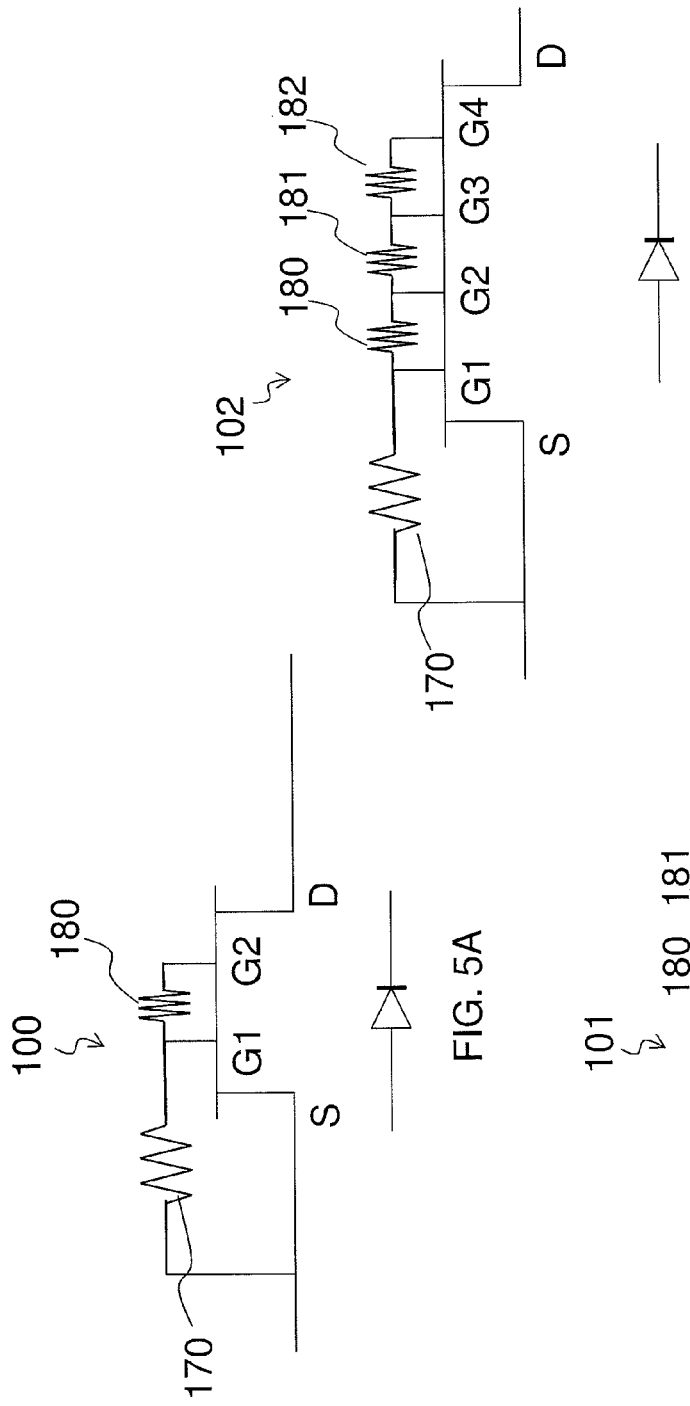
FIG. 5A~5C are circuit diagrams showing embodiments of the type III compound semiconductor ESD protection device provided by the present invention.

FIG. 5A~5C are circuit diagrams showing embodiments of the type III compound semiconductor ESD protection device provided by the present invention. The type III compound semiconductor ESD protection device comprises a multi-gate E-FET (100~102), at least one seventh resistor 170, and at least one eighth resistor (180~182). The multi-gate E-FET comprises a source electrode S, a drain electrode D, and plural gate electrodes (G1~G4) disposed between the source and drain electrodes. The plural gate electrodes are connected to the source or drain electrodes through the at least one seventh resistor. The multi-gate E-FET with unidirectionally connected gate electrodes acts as a single diode. Each of the one or more eighth resistors (180~182) is connected between two gate electrodes, so that the gate electrode can be connected indirectly through the one or more eighth resistors and a seventh resistor to the source or the drain electrodes. In the embodiments shown in FIG. 5A~5C, the gate electrode G1 is connected to the source electrode S through the seventh resistor 170, and the other gate electrodes are connected to the gate electrode G1 through one or more eighth resistors.

Figure 6A:
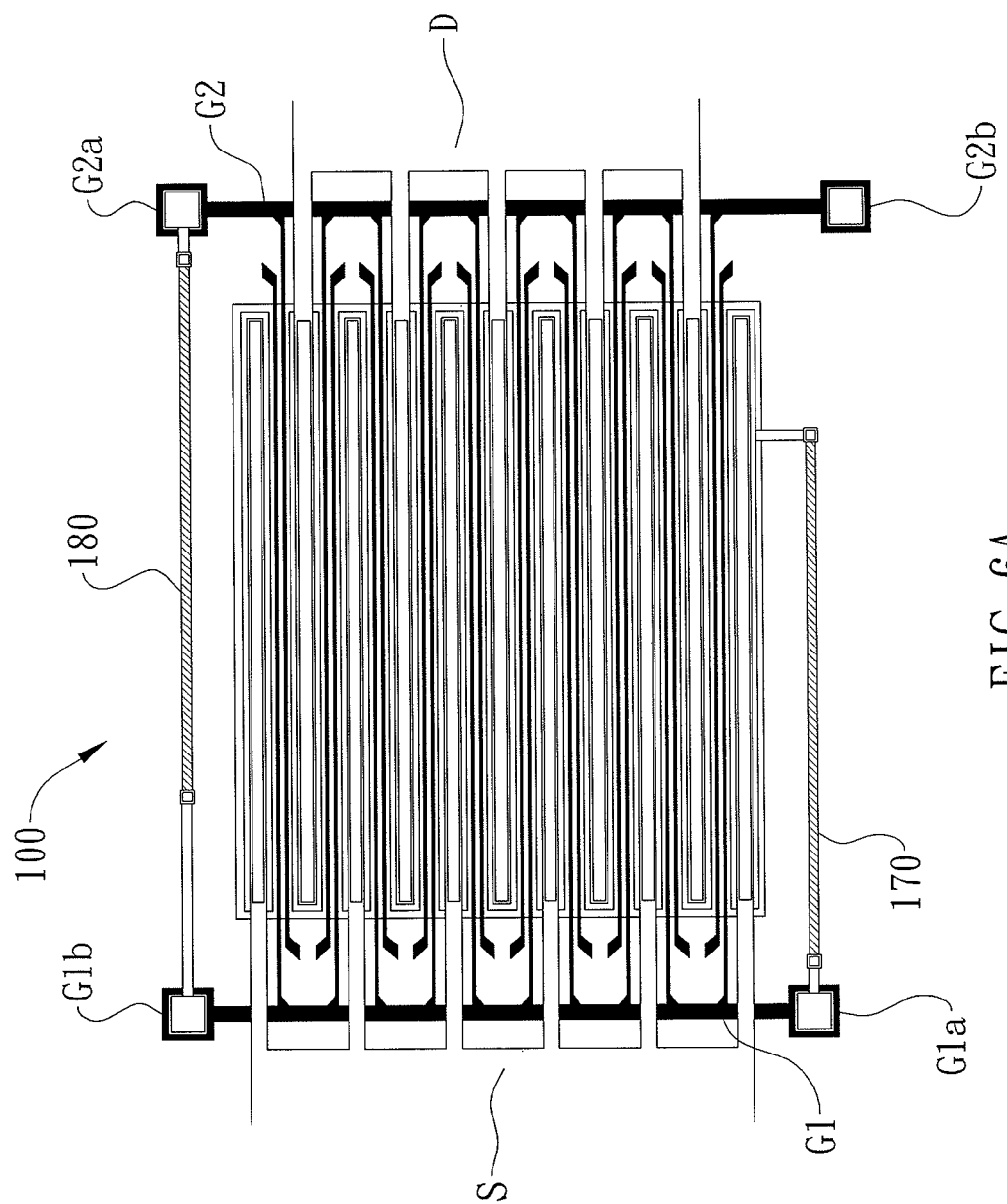
FIG. 6A~6C are schematics showing the plan view of embodiments of the circuit diagrams shown in FIG. 5A~5B provided by the present invention.
Figure 6B:
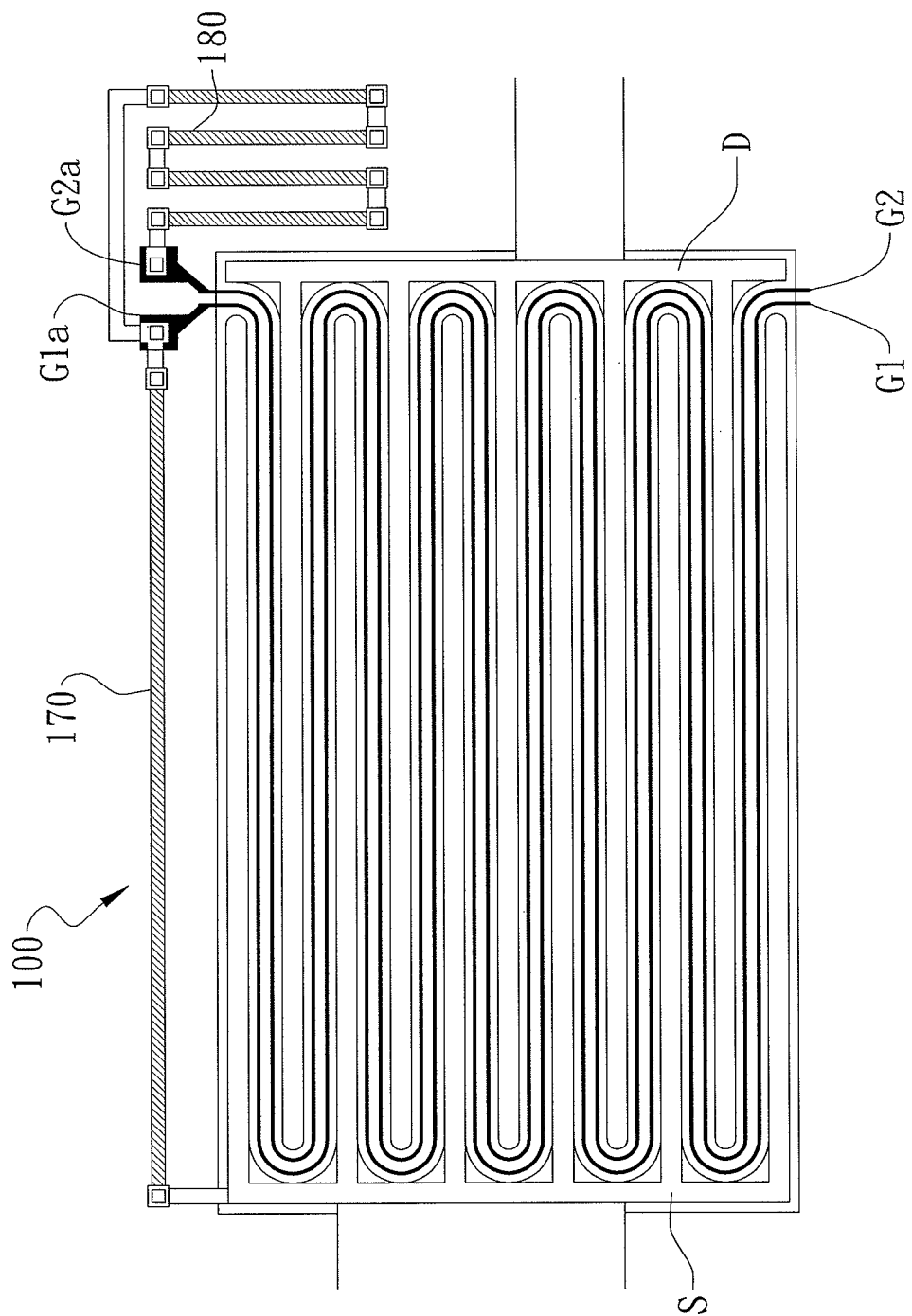

FIGS. 6A and 6B show two implementations of the circuit diagrams shown in FIG. 5A. The scheme of the implementation shown in FIG. 6A is similar to that of the implementations of the type I compound semiconductor ESD protection device shown in FIG. 2C. Gate electrode pads G1a and G1b are provided at two ends of the gate electrodes G1, and gate electrode pads G2a and G2b are provided at two ends of the gate electrodes G2. The seventh resistor 170 is connected between the gate electrode pad G1a and the source electrode S, and the eighth resistor 180 is connected between the gate electrode pads G1b and G2a. The scheme of the implementation shown in FIG. 6B is similar to that of the implementations of the type I compound semiconductor ESD protection device shown in FIG. 2A. Gate electrode pads G1a and G2a are provided at one end of the gate electrodes G1 and G2, respectively. The seventh resistor 170 is connected between the gate electrode pad G1a and the source electrode S, and the eighth resistor 180 is connected between the gate electrode pads G1a and G2a.

Figure 6C:
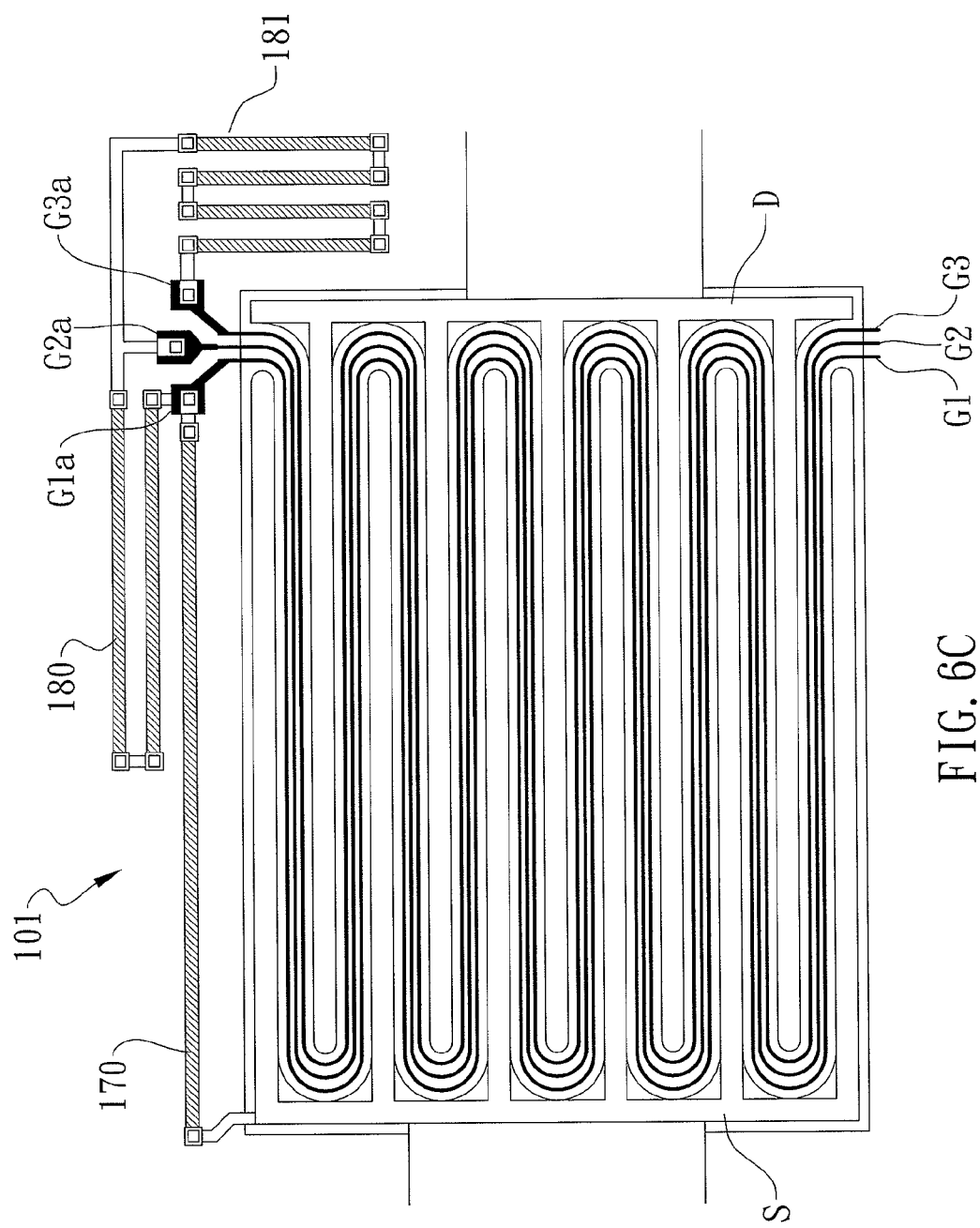
Figure 7A:
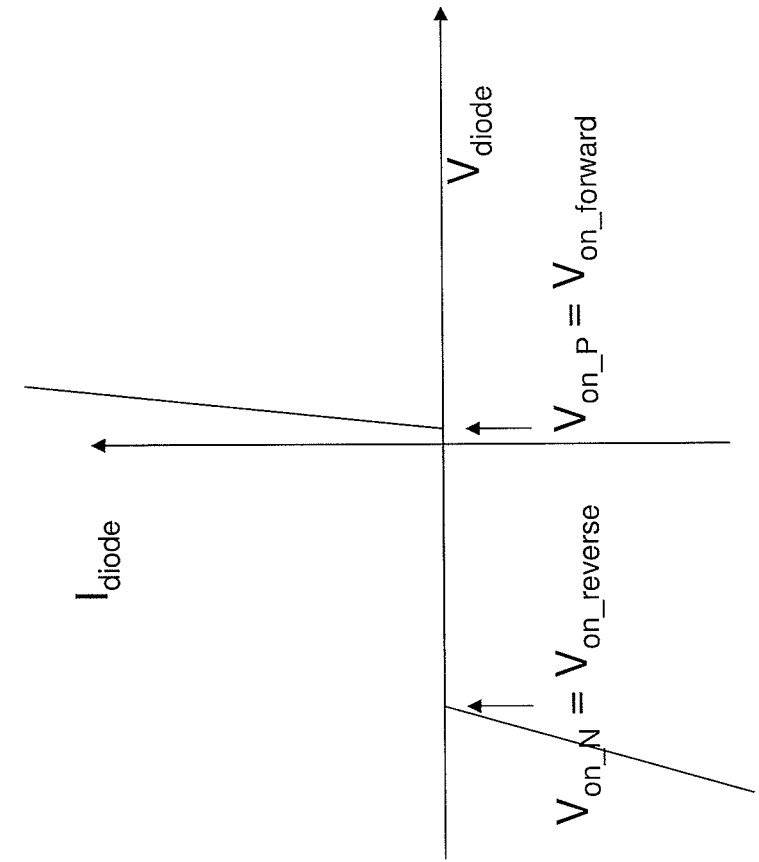
FIG. 7A~7D are schematics showing of ESD protection devices using E-FET diodes and the corresponding I-V curves according to previous technologies.
Figure 7A:
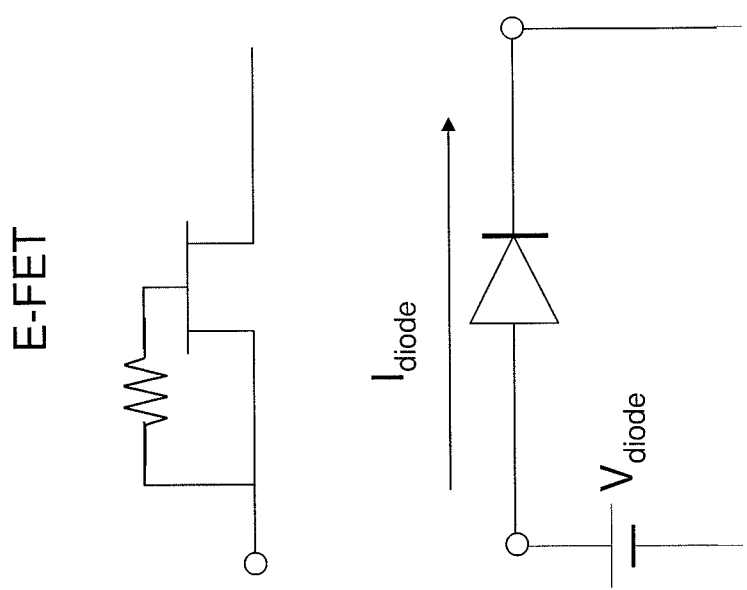
Figure 7B:
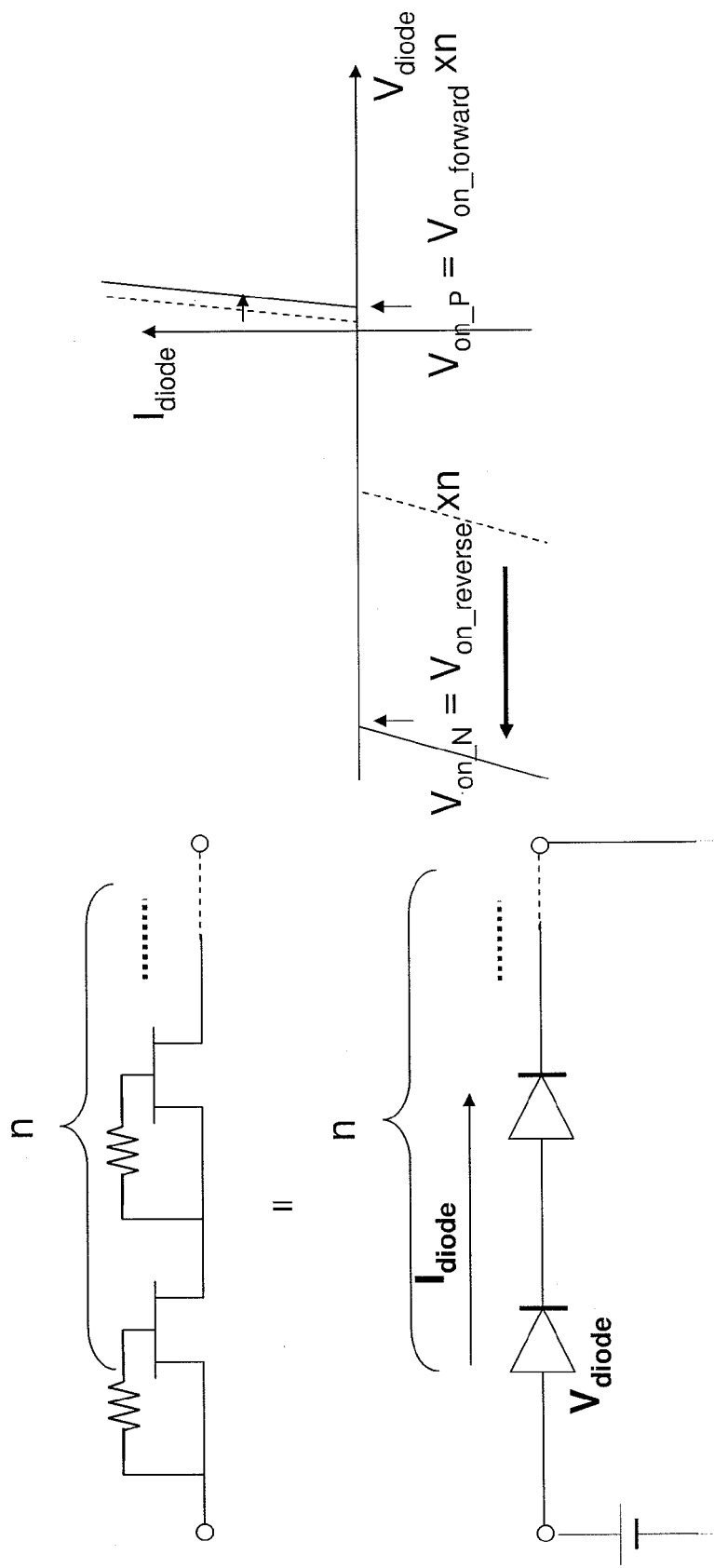
Figure 7C:
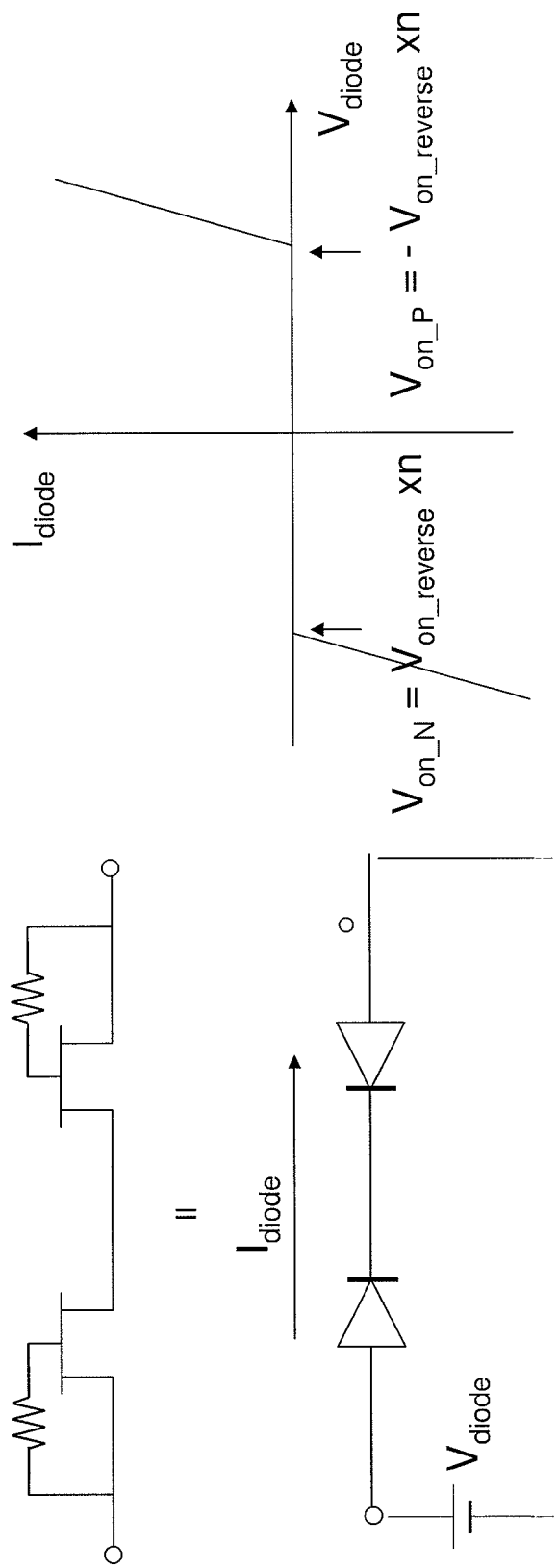
Figure 7D:
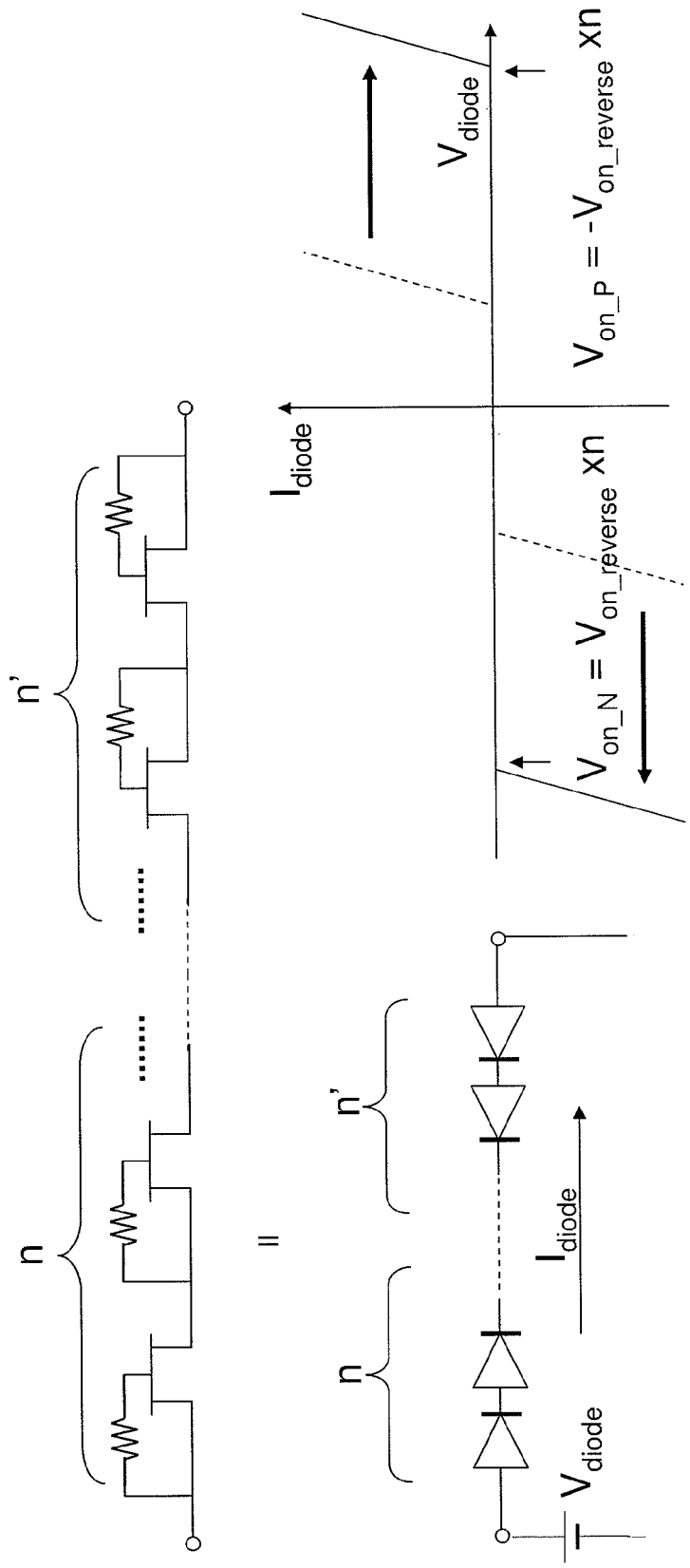

FIG. 6C shows an implementation of the circuit diagrams shown in FIG. 5B. The scheme of the implementation shown in FIG. 6C is also similar to that of the implementations of the type I compound semiconductor ESD protection device shown in FIG. 2A. The seventh resistor 170 is connected between the gate electrode pad G1a and the source electrode S, the eighth resistor 180 is connected between the gate electrode pads G1a and G2a, and the eighth resistor 181 is connected between the gate electrode pads G2a and G3a.

The multi-gate E-FETs described above can be formed by the compound semiconductor material GaAs or GaN. For GaAs E-FET, it can be a high electron mobility transistor (HEMT) or a pseudomorphic high electron mobility transistor (pHEMT). The width of each gate electrode of the plural gate electrodes is ranging from 0.1 mm to 10 mm, preferably 1 mm. The resistance of the first to the eigth resistor is ranging from $2\times10^2$ to $2\times10^4$ ohms, preferably $1\times10^3$ to $1\times10^4$ ohms. Each of the embodiments of the compound semiconductor ESD protection device mentioned above includes a multi-gate E-FET. The compound semiconductor ESD protection device can also include plural multi-gate E-FETs connected in series according to the present invention. The compound semiconductor ESD protection device can also include at least one multi-gate E-FET according to the present invention and at least one conventional single-gate E-FET connected in series.

To sum up, the present invention can indeed get its anticipated object to provide compound semiconductor ESD protection devices. The present invention has the following advantages:

1. The compound semiconductor ESD protection devices provided by the present invention use compound semiconductor multi-gate E-FETs instead of series connected E-FET diodes. The total device area can therefore be made smaller.
2. The compound semiconductor ESD protection devices provided by the present invention use compound semiconductor multi-gate E-FETs, so that a circuit comprising E-FETs and the ESD protection circuits for it can be integrated on the same chip. By using the on-chip ESD protection circuits, the size of the integrated circuit can be greatly reduced and the manufacturing process of it can be significantly simplified.
3. The compound semiconductor ESD protection devices provided by the present invention using compound semiconductor multi-gate E-FETs with at lease one of the gate electrodes connected by a resistor to another gate electrode connected by another resistor to the source electrode, the drain electrode, or the inter-gate region between two adjacent gate electrodes. The input RF signal is divided into the two gate electrodes connected with the resistor. As a result, the RF voltage amplitude of each of the gate electrodes is reduced and the overall linearity of the ESD protection device is improved.

The description referred to the drawings stated above is only for the preferred embodiments of the present invention. Many equivalent local variations and modifications can still be made by those skilled at the field related with the present invention and do not depart from the spirits of the present invention, so they should be regarded to fall into the scope defined by the appended claims.

What is claimed is:

1. A compound semiconductor electrostatic discharge (ESD) protection device, comprising:
    a multi-gate enhancement-mode field effect transistor (E-FET), which comprises a source electrode, a drain electrode, and plural gate electrodes disposed between the source and drain electrodes;
    at least one first resistor, through which the source electrode is connected to at least one of the plural gate electrodes; and
    at least one second resistor, through which the drain electrode is connected to at least one of the plural gate electrodes,
    wherein two gate electrodes among the plural gate electrodes are connected by a third resistor.

2. The compound semiconductor ESD protection device according to claim 1, wherein the multi-gate E-FET is a GaAs FET.

3. The compound semiconductor ESD protection device according to claim 2, wherein the multi-gate E-FET is a high electron mobility transistor (HEMT) or a pseudomorphic high electron mobility transistor (pHEMT).

4. The compound semiconductor ESD protection device according to claim 1, wherein the multi-gate E-FET is a GaN FET.

5. The compound semiconductor ESD protection device according to claim 1, wherein the width of each gate electrode of the plural gate electrodes is ranging from 0.1 mm to 10 mm.

6. The compound semiconductor ESD protection device according to claim 1, wherein the resistance of the first, second, and third resistor is ranging from $2\times10^2$ to $2\times10^4$ ohms.

7. A compound semiconductor electrostatic discharge (ESD) protection device, comprising:
a multi-gate enhancement-mode field effect transistor (E-FET), which comprises a source electrode, a drain electrode, and plural gate electrodes disposed between the source and drain electrodes; and
at least one fourth resistor, through which at least one of the plural gate electrodes is connected to at least one of the inter-gate regions between two adjacent gate electrodes,
wherein at east one of the plural gate electrodes are connected to the source or drain electrodes through at least one fifth resistor.

8. The compound semiconductor ESD protection device according to claim 7, wherein two gate electrodes among the plural gate electrodes are connected by a sixth resistor.

9. The compound semiconductor ESD protection device according to claim 8, wherein the resistance of the fourth, fifth and sixth resistor is ranging from $2\times10^2$ to $2\times10^4$ ohms.

10. The compound semiconductor ESD protection device according to claim 7, wherein the multi-gate E-FET is a GaAs FET.

11. The compound semiconductor ESD protection device according to claim 10, wherein the multi-gate E-FET is a high electron mobility transistor (HEMT) or a pseudomorphic high electron mobility transistor (pHEMT).

12. The compound semiconductor ESD protection device according to claim 7, wherein the multi-gate E-FET is a GaN FET.

13. The compound semiconductor ESD protection device according to claim 7, wherein the width of each gate electrode of the plural gate electrodes is ranging from 0.1 mm to 10 mm.

14. A compound semiconductor electrostatic discharge (ESD) protection device, comprising:
a multi-gate enhancement-mode field effect transistor (E-FET), which comprises a source electrode, a drain electrode, and plural gate electrodes disposed between the source and drain electrodes;
at least one seventh resistor through which at least one of the plural gate electrodes is connected to the source or drain electrodes; and
two gate electrodes among the plural gate electrodes are connected by an eighth resistor.

15. The compound semiconductor ESD protection device according to claim 14, wherein the multi-gate E-FET is a GaAs FET.

16. The compound semiconductor ESD protection device according to claim 15, wherein the multi-gate E-FET is a high electron mobility transistor (HEMT) or a pseudomorphic high electron mobility transistor (pHEMT).

17. The compound semiconductor ESD protection device according to claim 14, wherein the multi-gate E-FET is a GaN FET.

18. The compound semiconductor ESD protection device according to claim 14, wherein the source and drain electrodes are finger electrodes interposed each other, and the plural gate electrodes are multi-finger electrodes interposed each other disposed between the source and drain electrodes.

19. The compound semiconductor ESD protection device according to claim 14, wherein the source and drain electrodes are multi-finger electrodes interposed each other, and the plural gate electrodes are meandering gate electrodes disposed between the source and drain electrodes.

20. The compound semiconductor ESD protection device according to claim 14, wherein the width of each gate electrode of the plural gate electrodes is ranging from 0.1 mm to 10 mm.

21. The compound semiconductor ESD protection device according to claim 14, wherein the resistance of the seventh and eighth resistor is ranging from $2\times10^2$ to $2\times10^4$ ohms.

22. A compound semiconductor electrostatic discharge (ESD) protection device, comprising:
a multi-gate enhancement-mode field effect transistor (E-FET), which comprises a source electrode, a drain electrode, and plural gate electrodes disposed between the source and drain electrodes;
at least one first resistor, through which the source electrode is connected to at least one of the plural gate electrodes; and
at least one second resistor, through which the drain electrode is connected to at least one of the plural gate electrodes,
wherein the source and drain electrodes are multi-finger electrodes interposed each other, and the plural gate electrodes are multi-finger electrodes interposed each other disposed between the source and drain electrodes.

23. The compound semiconductor ESD protection device according to claim 22, wherein the multi-gate E-FET is a GaAs PET.

24. The compound semiconductor ESD protection device according to claim 23, wherein the multi-gate E-FET is a high electron mobility transistor (HEMT) or a pseudomorphic high electron mobility transistor (pHEMT).

25. The compound semiconductor ESD protection device according to claim 22, wherein the multi-gate E-FET is a GaN PET.

26. The compound semiconductor ESD protection device according to claim 22, wherein the width of each gate electrode of the plural gate electrodes is ranging from 0.1 mm to 10 mm.

27. The compound semiconductor ESD protection device according to claim 22, wherein the resistance of the first and second resistor is ranging from $2\times10^2$ to $2\times10^4$ ohms.

28. A compound semiconductor electrostatic discharge (ESD) protection device, comprising:
a multi-gate enhancement-mode field effect transistor (E-FET), which comprises a source electrode, a drain electrode, and plural gate electrodes disposed between the source and drain electrodes;
at least one first resistor, through which the source electrode is connected to at least one of the plural gate electrodes; and
at least one second resistor, through which the drain electrode is connected to at least one of the plural gate electrodes,
wherein the source and drain electrodes are multi-finger electrodes interposed each other, and the plural gate electrodes are meandering gate electrodes disposed between the source and drain electrodes.

29. The compound semiconductor ESD protection device according to claim 28, wherein the multi-gate E-FET is a GaAs FET.

30. The compound semiconductor ESD protection device according to claim 29, wherein the multi-gate E-FET is a high electron mobility transistor (HEMT) or a pseudomorphic high electron mobility transistor (pHEMT).

31. The compound semiconductor ESD protection device according to claim 28, wherein the multi-gate E-FET is a GaN FET.

32. The compound semiconductor ESD protection device according to claim 28, wherein the width of each gate electrode of the plural gate electrodes is ranging from 0.1 mm to 10 mm.

33. The compound semiconductor ESD protection device according to claim 28, wherein the resistance of the first and second resistor is ranging from $2 \times 10^2$ to $2 \times 10^4$ ohms.

34. A compound semiconductor electrostatic discharge (ESD) protection device, comprising:
   a multi-gate enhancement-mode field effect transistor (E-FET), which comprises a source electrode, a drain electrode, and plural gate electrodes disposed between the source and drain electrodes; and
   at least one fourth resistor, through which at least one of the plural gate electrodes is connected to at least one of the inter-gate regions between two adjacent gate electrodes, wherein two gate electrodes among the plural gate electrodes are connected by a sixth resistor.

35. The compound semiconductor ESD protection device according to claim 34, wherein the multi-gate E-FET is a GaAs FET.

36. The compound semiconductor ESD protection device according to claim 35, wherein the multi-gate E-FET is a high electron mobility transistor (HEMT) or a pseudomorphic high electron mobility transistor (pHEMT).

37. The compound semiconductor ESD protection device according to claim 34, wherein the multi-gate E-FET is a GaN FET.

38. The compound semiconductor ESD protection device according to claim 34, wherein the width of each gate electrode of the plural gate electrodes is ranging from 0.1 mm to 10 mm.

39. The compound semiconductor ESD protection device according to claim 34, wherein the resistance of the fourth and sixth resistor is ranging from $2 \times 10^2$ to $2 \times 10^4$ ohms.

40. A compound semiconductor electrostatic discharge (ESD) protection device, comprising:
   a multi-gate enhancement-mode field effect transistor (E-FET), which comprises a source electrode, a drain electrode, and plural gate electrodes disposed between the source and drain electrodes; and
   at least one fourth resistor, through which at least one of the plural gate electrodes is connected to at least one of the inter-gate regions between two adjacent gate electrodes, wherein the source and drain electrodes are multi-finger electrodes interposed each other, and the plural gate electrodes are meandering gate electrodes disposed between the source and drain electrodes.

41. The compound semiconductor ESD protection device according to claim 40, wherein the multi-gate E-FET is a GaAs FET.

42. The compound semiconductor ESI) protection device according to claim 41, wherein the multi-gate E-FET is a high electron mobility transistor (HEMT) or a pseudomorphic high electron mobility transistor (pHEMT).

43. The compound semiconductor ESD protection device according to claim 40, wherein the multi-gate E-FET is a GaN FET.

44. The compound semiconductor ESD protection device according to claim 40, wherein the width of each gate electrode of the plural gate electrodes is ranging from 0.1 mm to 10 mm.

45. The compound semiconductor ESD protection device according to claim 40, wherein the resistance of the fourth resistor is ranging from $2 \times 10^2$ to $2 \times 10^4$ ohms.

\* \* \* \* \*